(12) United States Patent
Price et al.

(10) Patent No.: US 12,291,775 B2
(45) Date of Patent: *May 6, 2025

(54) DEPOSITING COATINGS ON AND WITHIN HOUSINGS, APPARATUS, OR TOOLS

(71) Applicant: Halliburton Energy Services, Inc., Houston, TX (US)

(72) Inventors: James M. Price, Houston, TX (US); Michael T. Pelletier, Houston, TX (US); Jian Li, Houston, TX (US); William Joseph Soltmann, Houston, TX (US); Christopher Michael Jones, Houston, TX (US); Anthony Herman Van Zuilekom, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 241 days.

This patent is subject to a terminal disclaimer.

(21) Appl. No.: 17/751,071

(22) Filed: May 23, 2022

(65) Prior Publication Data

US 2022/0282365 A1 Sep. 8, 2022

Related U.S. Application Data

(62) Division of application No. 16/717,947, filed on Dec. 17, 2019, now Pat. No. 11,371,137.

(Continued)

(51) Int. Cl.
*C23C 16/04* (2006.01)
*C23C 16/02* (2006.01)
(Continued)

(52) U.S. Cl.
CPC ........ *C23C 16/045* (2013.01); *C23C 16/0227* (2013.01); *C23C 16/45536* (2013.01);
(Continued)

(58) Field of Classification Search
CPC .............. C23C 16/045; C23C 16/0227; C23C 16/45536; C23C 16/45544; C23C 16/45555

See application file for complete search history.

(56) References Cited

U.S. PATENT DOCUMENTS 5,154,862 A 10/1992 Reagan et al.
6,416,577 B1 * 7/2002 Suntoloa ................. C23C 16/46
117/88

(Continued)

FOREIGN PATENT DOCUMENTS

JP  06279998 A  10/1994
JP  2004337835 A  12/2004

(Continued)

OTHER PUBLICATIONS

Filing Receipt and Specification of Provisional Application entitled "Depositing Coatings on and Within a Well Tool Using a Well Tool Coating System Positioned Inside the Well Tool," by James M. Price, filed Mar. 15, 2019 as U.S. Appl. No. 62/819,244.

(Continued)

*Primary Examiner* — Kelly M Gambetta
(74) *Attorney, Agent, or Firm* — Conley Rose, P.C.; Rodney B. Carroll

(57) ABSTRACT

A device for coating an interior surface of a housing defining a volume comprising a plurality of reactant gas sources including reactant gases for one or more surface coating processes; first and second closures to sealingly engage with an inlet and outlet of the volume of the housing to provide an enclosed volume; a delivery line fluidically coupled to the first closure and the plurality of reactant gas sources to deliver the reactant gases to the enclosed volume; and an output line fluidically coupled to the second closure to remove one or more reactant gases, byproduct gases, or both (Continued)

from the enclosed volume. A method for coating an interior surface of a housing is also provided.

27 Claims, 7 Drawing Sheets

Related U.S. Application Data

(60) Provisional application No. 62/819,194, filed on Mar. 15, 2019.

(51) Int. Cl.
  *C23C 16/455* (2006.01)
  *H01J 37/32* (2006.01)

(52) U.S. Cl.
  CPC .. *C23C 16/45544* (2013.01); *C23C 16/45555* (2013.01); *H01J 37/32357* (2013.01); *H01J 37/32394* (2013.01)

(56) References Cited

U.S. PATENT DOCUMENTS

| | | | |
|---|---|---|---|
| 6,508,453 | B2 | 1/2003 | Mamyo |
| 6,863,130 | B2 | 3/2005 | Steele et al. |
| 7,300,684 | B2 | 11/2007 | Boardman et al. |
| 7,608,151 | B2 | 10/2009 | Tudhope et al. |
| 8,029,875 | B2 | 10/2011 | Wei et al. |
| 8,505,480 | B2 | 8/2013 | Biana |
| 8,753,725 | B2 | 6/2014 | Wei et al. |
| 9,238,864 | B2 | 1/2016 | Pelletier |
| 11,125,083 | B2 | 9/2021 | Jones et al. |
| 2003/0196600 | A1 | 10/2003 | Eidelman |
| 2006/0198965 | A1* | 9/2006 | Tudhope ............ C23C 16/45578 427/248.1 |
| 2012/0298901 | A1 | 11/2012 | Ringgenberg |
| 2014/0154417 | A1 | 6/2014 | Choi et al. |
| 2014/0178637 | A1 | 6/2014 | Rajagopalan et al. |
| 2014/0260955 | A1 | 9/2014 | Aharonov |
| 2014/0287161 | A1 | 9/2014 | Ertas et al. |
| 2015/0059910 | A1 | 3/2015 | Honda et al. |
| 2015/0079309 | A1 | 3/2015 | Krueger et al. |
| 2016/0290103 | A1* | 10/2016 | Fontenelle ............. C23C 14/24 |
| 2018/0044800 | A1 | 2/2018 | Hendrix et al. |
| 2020/0017960 | A1 | 1/2020 | Tudhope et al. |
| 2020/0291519 | A1 | 9/2020 | Price |
| 2022/0062947 | A1 | 3/2022 | Jones et al. |
| 2022/0064793 | A1 | 3/2022 | Jones et al. |

FOREIGN PATENT DOCUMENTS

| | | |
|---|---|---|
| JP | 4437647 B2 | 3/2010 |
| KR | 100346019 B1 | 8/2002 |
| KR | 1020090114997 A | 11/2009 |
| KR | 1020140076251 A | 6/2014 |
| KR | 101446197 B1 | 10/2014 |
| KR | 20160001133 U | 4/2016 |
| WO | 2014042622 A1 | 3/2014 |
| WO | 2017095361 A1 | 6/2017 |
| WO | 2019040843 A1 | 2/2019 |
| WO | 2022046115 A1 | 3/2022 |
| WO | 2022046116 A1 | 3/2022 |

OTHER PUBLICATIONS

Foreign Communication from a related counterpart application—International Search Report and Written Opinion, PCT/US2015/062910, Aug. 29, 2016, 13 pages.
Foreign Communication from Related Application—International Search Report and Written Opinion of the International Searching Authority, International Application No. PCT/US2019/067203, dated Apr. 21, 2020, 14 pages.
Foreign Communication from Related Application—International Search Report and Written Opinion of the International Searching Authority, International Application No. PCT/US2019/067204, dated Apr. 21, 2020, 11 pages.
Foreign Communication from Related Application—International Search Report and Written Opinion of the International Searching Authority, International Application No. PCT/US2020/048791, dated May 21, 2021, 11 pages.
Foreign Communication from Related Application—International Search Report and Written Opinion of the International Searching Authority, International Application No. PCT/US2020/048794, dated May 27, 2021, 11 pages.
Filing Receipt, Specification and Drawings for U.S. Appl. No. 62/819,194, entitled "Depositing Coatings on and Within Tools," filed Mar. 15, 2019, 33 pages.
Office Action (30 Pages), Jan. 30, 2023, U.S. Appl. No. 17/004,707, filed Aug. 27, 2020.
Office Action (34 Pages), Jan. 30, 2023, U.S. Appl. No. 17/004,724, filed Aug. 27, 2020.
Filing receipt and specification for patent application entitled "Depositing Coatings on and Within Housings, Apparatus, or Tools Utilizing Pressurized Cells," Christopher Michael Jones et al., filed Aug. 6, 2023 as U.S. Appl. No. 18/242,798.
Filing receipt and specification for patent application entitled "Depositing Coatings on and Within Housings, Apparatus, or Tools Utilizing Counter Current Flow of Reactants," Christopher Michael Jones et al., filed Sep. 6, 2023 as U.S. Appl. No. 18/242,790.

* cited by examiner

DEPOSITING COATINGS ON AND WITHIN HOUSINGS, APPARATUS, OR TOOLS

REFERENCE TO RELATED APPLICATIONS

This application is a divisional of and claims priority to U.S. patent application Ser. No. 16/717,947, filed on Dec. 17, 2019, published as U.S. Patent Application Publication No. 2020/0291512 A1, and entitled "Depositing Coatings on and Within Housings, Apparatus, or Tools," which claims priority to U.S. Provisional Patent Application No. 62/819,194, filed on Mar. 15, 2019, and titled "Depositing Coatings On and Within Tools," both of which are incorporated by reference herein in their entirety.

TECHNICAL FIELD

The present disclosure relates generally to depositing coatings within housings, apparatus, or tools, such as well tools for use in a wellbore. More specifically, but not by way of limitation, this disclosure relates to depositing coatings on one or more interior surfaces of a housing, apparatus, or tool, for example, well tools.

BACKGROUND

In applications, it can be desirable to deposit a coating on an interior surface of a housing, apparatus, or tool (e.g., within a well tool) to withstand a particular environment to which the surface will be exposed during operation. For example, well tools for performing downhole operations are often subject to internal corrosion and abrasion as fluids flow through the well tools. Fluids such as hydrogen sulfide and mercury can also chemically react with (or be absorbed by) the interiors of the well tools. These destructive influences can reduce the lifespans of the well tools and cause a variety of other problems. A coating is sometimes deposited on a surface to withstand such environments and prolong tool life.

BRIEF SUMMARY OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
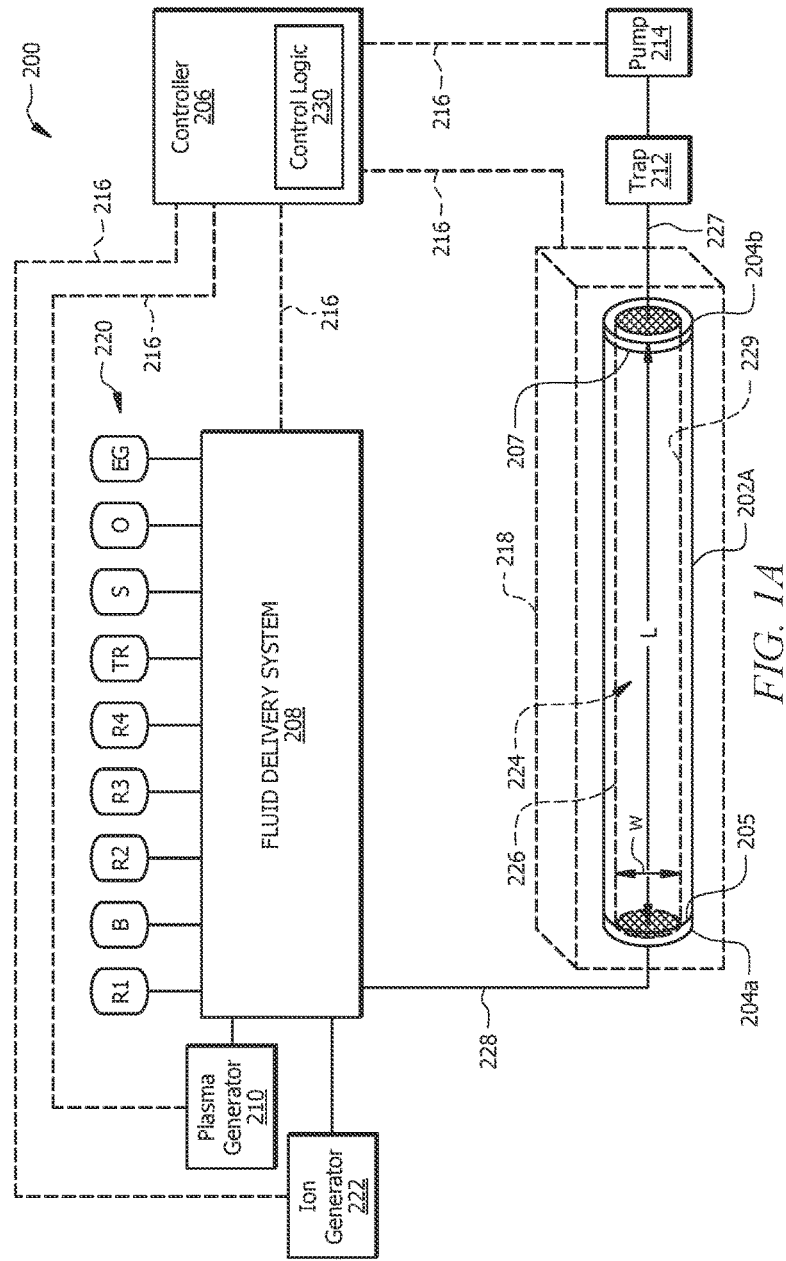
FIG. 1A is a schematic diagram of an example of a coating system according to some aspects.

It should be understood at the outset that although an illustrative implementation of one or more embodiments are provided below, the disclosed systems and/or methods may be implemented using any number of techniques, whether currently known or in existence. This disclosure, including the illustrative implementations, drawings, techniques and exemplary designs described herein, may be modified within the scope of the appended claims along with their full scope of equivalents.

Certain aspects and features of the present disclosure relate to a hybrid-type tool coating system (also referred to herein as a "coating system" or "coating device" or simply "device") and method for depositing coatings on site, on (or more specifically inside of or on an interior surface of, e.g., on a surface adjacent an interior volume of) a housing, apparatus, or tool (e.g., a well tool), optionally using one or both of a chemical vapor deposition (CVD) process and an atomic layer deposition (ALD) process. The coatings can resist physical wear on the interior surface of the housing, apparatus or tool (e.g., well tool) due to abrasive or corrosive elements flowing therethrough, resist the interior surface of the housing, apparatus or tool (e.g., well tool) from chemically reacting with or absorbing fluids, and otherwise serve as a protective barrier to resist destruction of the interior surface of the housing, apparatus or tool (e.g., well tool). The disclosed aspects of the coating system, as further detailed below, allow it to be made compact and portable for enabling it to be used at any suitable location, such as at a jobsite, worksite, or wellsite, in a laboratory environment, or elsewhere.

Any of a variety of housings, apparatus, or tools such as well tools (also referred to herein as wellbore tools or downhole tools) may have an interior surface on which to deposit a coating. Housings, apparatus, and tools such as well tools come in different shapes and sizes and also may have one or more passages connecting the interior region (also referred to herein as an "interior volume" or simply "volume") to other regions inside the housing, apparatus, or tool (e.g., well tool) and/or an external environment outside the housing, apparatus, or tool (e.g., well tool). In some examples of the present disclosure, an enclosed volume or enclosed interior volume may be formed within a selected housing, apparatus, or tool (e.g., well tool) using a closure, which may comprise one or more closure elements (e.g. plugs, gaskets, o-rings, non-circular sealing elements, threaded couplings, or any of a variety of other ways to block and preferably to sealingly close off a selected portion of one or more flow passages). The closure elements can have any suitable shape configured to block and conform as required to openings or passages leading into and out of the interior region of the housing, apparatus, or tool (e.g., well tool), to thereby enclose the internal volume of the housing, apparatus, or tool (e.g., well tool) having the internal surface(s) to be coated.

In some examples, the closure may be a single closure element that closes off a portion of an internal volume of the housing, apparatus, or tool (e.g., well tool), where the remainder of that internal volume is a sealed volume as defined by the housing, apparatus, or tool itself. In another example, an internal portion of the housing, apparatus, or tool (e.g., well tool) having the surface to be coated may be open at both ends, and the closure may comprise two closure elements that close off the internal volume at those ends. Any number (e.g. more than 2) of closure elements may be used to more specifically close off a portion of the housing, apparatus, or tool (e.g., well tool) to be internally coated, particularly in the event of complex internal shapes where some features are to be coated and other internal features are not to be coated (e.g. sensitive or non-metallic, non-wear features).

The closure elements may be structurally separate elements of a coating system that are releasably secured to the housing, apparatus, or tool (e.g., well tool), or the closure elements may be permanently attached to the housing, apparatus, or tool (e.g., well tool) and movable in and out of a closed position for closing selected internal locations of the housing, apparatus, or tool (e.g., well tool). For purpose of illustration, an example housing, apparatus, or tool (e.g., well tool) may have a cavity with a circular or other shaped cross-section, which may be closed off with a closure element at an upstream end and a closure element at a downstream end, thereby enclosing a volume within the cavity between the upstream and downstream closure elements.

In any given example, the enclosed volume may function as a de facto deposition chamber within the housing, apparatus, or tool (e.g., well tool) itself, into which one or more reactant gases and other gases useful in a coating process may be introduced, via a gas delivery system (i.e. gas supply system).

At a high level, the gas supply system may comprise any of a variety of mechanical flow control elements that fluidly couple the one or more gas sources to the enclosed volume of the housing, apparatus, or tool (e.g., well tool), such as any combination of supply lines, manifolds, valves, pumps, and/or other flow control element(s). The gas supply system can be used to selectively couple selected ones of the plurality of reactant gas sources (or other process fluids) with the enclosed volume of the housing, apparatus, or tool (e.g., well tool).

In one example, a supply line with a valve coupled between a reactant gas source and the enclosed volume may be used to selectively open or close flow of that reactant gas source to the internal volume; and another supply line and/or valve may be used to selectively open or close flow of another reactant gas source to the internal volume, and the gas supply system may be operated such that only the selected gas(es) or other fluid(s) is/are supplied to the enclosed volume at any given time. One or more ports may be provided on the housing, apparatus, or tool (e.g., well tool) for selectively coupling the different gas sources to the enclosed volume. Although not required, these ports may be provided on the closure or closure elements themselves, such as a first closure element with a port for coupling one or more gas source to an upstream end of the enclosed volume of the housing, apparatus, or tool (e.g., well tool) and a downstream closure element with a port for coupling one or more other gas source to a downstream end of the enclosed volume of the housing, apparatus, or tool (e.g., well tool).

A controller may also be operably coupled to the gas supply system to control the flow of different gases (or other fluids) to the enclosed volume having the surface to be coated. Although not required, the controller may be an electronic controller having control logic for controlling and optionally automating a sequence of gases, for processes like ALD and CLD that entail a very specific sequence of reactant gases such as those example processes detailed below.

In one application, once the deposition chamber (e.g., enclosed interior volume) is created as described above, a coating system can introduce reactant gases into the deposition chamber (e.g., via pathways through the closures) in order to perform one or more surface coating processes. For example, the coating system can include a fluid delivery system, e.g. a gas supply system, for selectively supplying the reactant gases to the deposition chamber inside the housing, apparatus, or tool (e.g., well tool). As used herein, reactant gases are gases that chemically react with a surface to produce a coating on the surface. Some examples of reactant gases include silane, methane, and carbon monoxide, and other examples are provided below. The coating system can contain sufficient reactant gases to perform both a CVD process and an ALD process inside the housing, apparatus, or tool (e.g., well tool), making it a hybrid system capable of performing more than one type of surface coating process. The coating system further includes a controller configured to control the fluid delivery system in order to apply the CVD process, the ALD process, or both to the deposition chamber inside the housing, apparatus, or tool (e.g., well tool).

Creating the deposition chamber inside the housing, apparatus, or tool (e.g., well tool) can enable the coating system to be used at any suitable location, without disassembling the housing, apparatus, or tool (e.g., well tool) into subcomponents and without the need for an expensive commercial vacuum-chamber as the deposition chamber. Rather, some examples of the present disclosure enable a surface coating process to be applied to a housing, apparatus, or tool (e.g., well tool) located at a jobsite or worksite (e.g., a wellsite), as many times as desired (e.g., after each job using the housing, apparatus, or tool). The coating system can also cost less than traditional deposition systems, since forming a deposition chamber inside a housing, apparatus, or tool (e.g., well tool) is cheaper and faster than installing a commercial-grade vacuum chamber at a manufacturing or laboratory facility, which may be governed by tight regulations and cleanroom requirements.

The hybrid nature of the coating system can also promote surface coating in challenging conditions, unlike traditional deposition systems that only apply one type of surface coating process. For example, if an interior surface of a housing, apparatus, or tool (e.g., well tool) is poorly conditioned for ALD due to damage or other factors, a coating system of the present disclosure can first apply a base coating inside the housing, apparatus, or tool (e.g., well tool) using a CVD process to promote bonding during a subsequent ALD process. If an interior surface of a housing, apparatus, or tool (e.g., well tool) is poorly conditioned for CVD due to damage or other factors, the coating system can first apply a base coating inside the housing, apparatus, or tool (e.g., well tool) using an ALD process to promote bonding during a subsequent CVD process.

Disclosed herein is a device for coating an interior surface of a housing defining a volume comprising a plurality of reactant gas sources including reactant gases for one or more surface coating processes; first and second closures to sealingly engage with an inlet and outlet of the volume of the housing to provide an enclosed volume; a delivery line fluidically coupled to the first closure and the plurality of reactant gas sources to deliver the reactant gases to the enclosed volume; and an output line fluidically coupled to the second closure to remove one or more reactant gases, byproduct gases, or both from the enclosed volume.

Further disclosed herein is a method of coating an interior surface of a housing defining a volume, the method comprising enclosing all or a portion of the volume of the housing to yield an enclosed volume; introducing one or more reactant gases, plasma, or a combination thereof to the enclosed volume; and forming one or more coating layers on all or a portion of an interior surface adjacent the enclosed volume via reaction of the reactant gases, the plasma, or the combination thereof.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure. The herein disclosed coating system can be utilized to deposit one or more coatings on an interior surface of a housing, apparatus, or tool (also referred to both individually and collectively herein by any individual term "tool", "housing", or "apparatus"), for example as will be described further herein with reference to FIG. 1A. Accordingly, the description herein is thus applicable to generic coating systems for coating generic apparatus, housings, or tools. Likewise, the description herein is applicable to, without limitation, specific uses such as, without limitation, "well tool coating systems" and "well tools", for example as will be described further herein with reference to FIG. 1B. By way of example, the term "housing" includes, but is not limited to, a structural component having an interior volume such as (without limitation) one or more components of an apparatus, device, or tool such as well tool. While certain description herein is made with reference to well tools and well tool coating systems, in should be understood that the concepts disclosed herein are not limited to any specific embodiment such as well tools and well tool coating systems but rather may be applied generally to coating systems configured to effectively coat an interior surface adjacent an interior volume disposed within a housing, apparatus, or coating by any of the various techniques (e.g., ALD and/or CVD deposition techniques) disclosed herein.

Figure 1B:
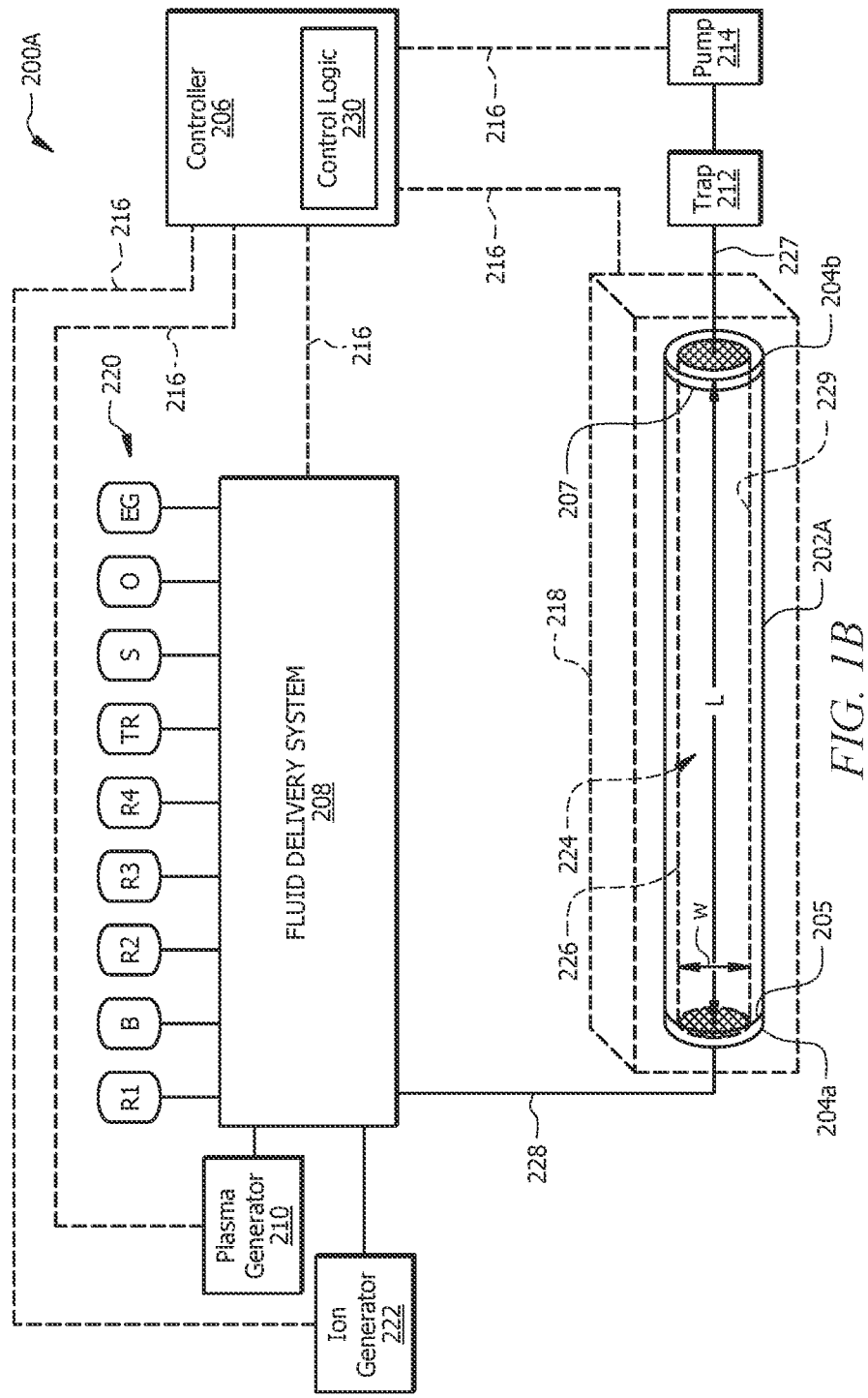
FIG. 1B is a schematic diagram of an example of a well tool coating system according to some aspects.

FIG. 1A is a schematic diagram of an example of a coating system 200 that can apply one or more coatings on or inside a generic housing, apparatus or tool 202, also referred to herein as a housing 202, an apparatus 202, or a tool 202. As noted hereinabove, a coating system of this disclosure can be utilized to deposit one or more coatings on or within a variety of housings, apparatus, or tools. One such embodiment is depicted in FIG. 1B, which is a schematic diagram of an example of a coating system 200A (also referred to herein as a "well tool coating system 200A") being utilized to apply one or more coatings on or inside a well tool 202A. Well tool 202A is usable for performing one or more downhole operations, such as drilling, logging, fracturing, fishing, pulling, casing, cementing, or any combination of these or other downhole operation.

Figure 2:
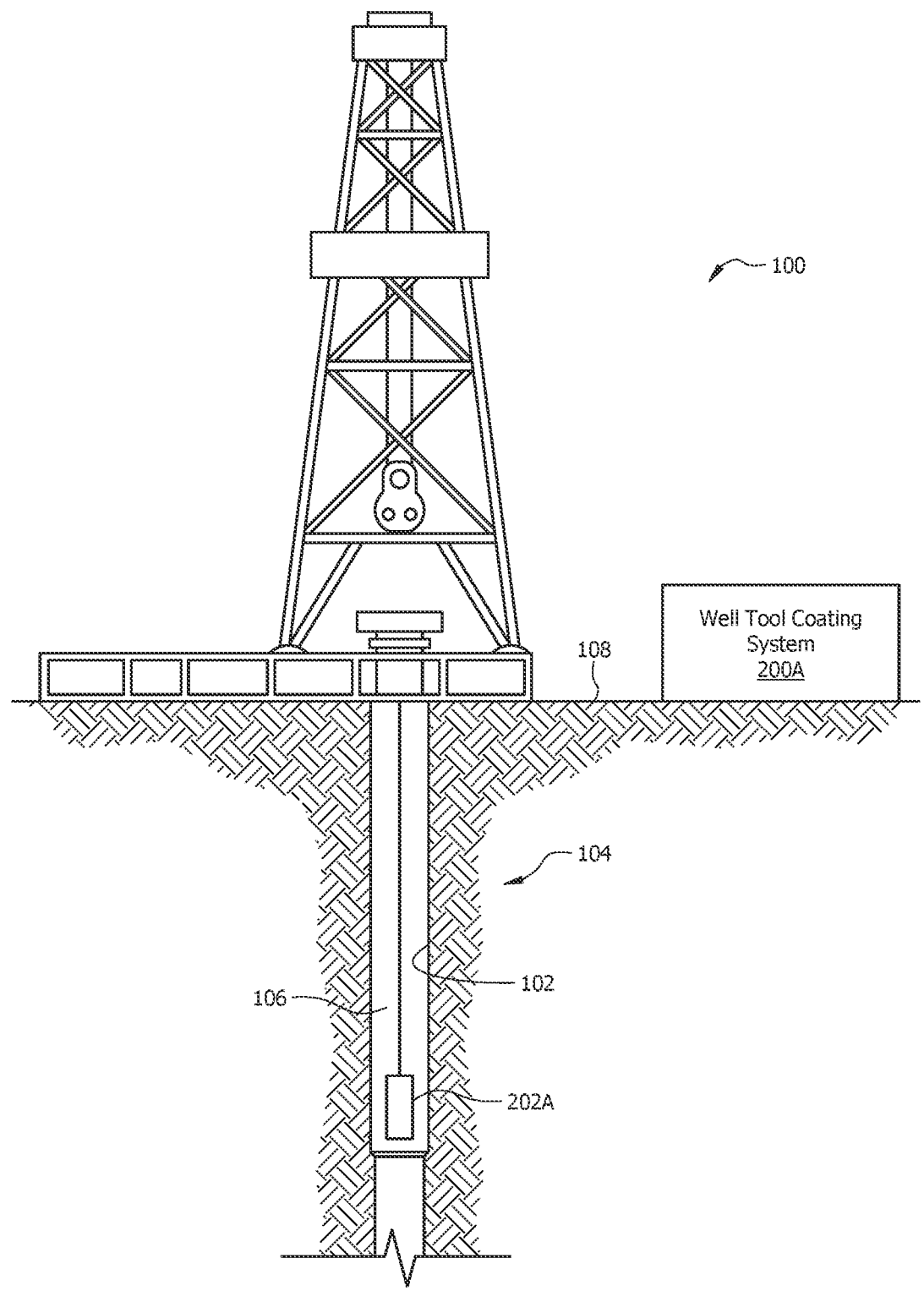
FIG. 2 is a generalized cross-sectional side view of an example of a well system with a well tool coating system according to some aspects.

FIG. 2 is a generalized cross-sectional side view of an example of a wellsite 100 at which a wellbore 102 is drilled through various earth strata of a subterranean formation 104 bearing hydrocarbons. The wellbore 102 is at least partially drilled and completed in this example, including a casing string 106 cemented within the wellbore 102 that extends from the well surface 108 through at least a portion of the drilled subterranean formation 104. The casing string 106 can provide a conduit through which produced formation fluids (e.g., production fluids) can travel from downhole to the well surface 108. Without being limited to the particular features of the illustrated well, it should be recognized that well tools suitable for coating according to this disclosure may be involved throughout the process of initially drilling, forming, and completing the wellbore 102, and throughout the service life of the wellbore 102 and beyond. The wellsite 100 of FIG. 2 is illustrated by way of example as an onshore well system, although the disclosure is equally applicable to wells formed offshore.

A coating system 200 according to this disclosure can be positioned at a jobsite (also referred to herein as a work site) for applying coatings on interior surfaces 229 of a housing, apparatus, or tool 202/well tool 202A at the jobsite. The coating system or device 200 can apply the coating(s) to the housing, apparatus, or tool 202/well tool 202A at any suitable time, such as before the tool performs an operation, after the tool performs an operation, or both. As will be described further hereinbelow, the coating system 200 can be capable of applying the coating(s) to the housing, apparatus, or tool 202/well tool 202A using multiple types of surface coating processes, such as ALD and/or CVD.

For example, and with reference to FIG. 1B, a well tool coating system 200A according to this disclosure can be positioned at the wellsite 100 (FIG. 2) for applying coatings on interior surfaces 229 of a well tool 202A at the wellsite 100. The well tool coating system 200A can apply the coatings to the well tool 202A at any suitable time, such as before the well tool 202A performs a downhole operation, after the well tool 202A performs a downhole operation, or both. The well tool coating system 200A is capable of applying the coatings to the well tool 202A using multiple types of surface coating processes, such as ALD and CVD.

Figure 3:
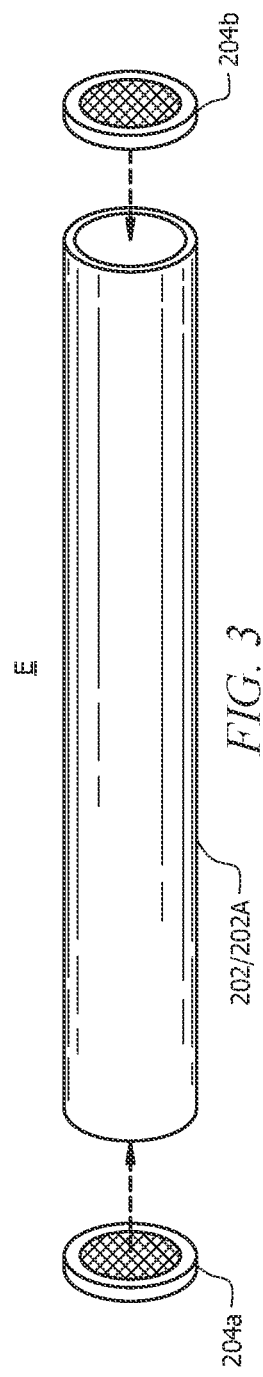
FIG. 3 is a perspective view of an example of a tool (e.g., a well tool) and closures according to some aspects.

More specifically, in FIG. 1A/FIG. 1B, the tool 202/well tool 202A has an interior region or interior volume 224 that is enclosed at the ends by closures (including first closure 204a and second closure 204b) in order to form an enclosed volume 226 (e.g., a deposition chamber) inside the tool 202/well tool 202A. The enclosed volume 226 is bound on the sides (e.g., along length L thereof) by the inner perimeter (e.g., inner circumference or interior surface 229) of the tool 202/well tool 202A and at the ends by the closures (e.g., first closure 204a and second closure 204b). FIG. 3 is a perspective view of an example of a housing, apparatus, or tool 202 (e.g., a well tool 202A) and first closure 204a and second closure 204b, according to some aspects. The closures (e.g., first closure 204a and second closure 204b) can include closure elements, such as valves, gaskets, end caps, or any other sealing device of suitable shape and size to seal (e.g., substantially seal) the interior region or volume 224 of the tool 202/well tool 202A from the external environment outside the tool 202/well tool 202A. In some examples, the closures (e.g., first closure 204a and second closure 204b) are existing parts (e.g., disks, stoppers, plugs, caps, valves or gates) of the tool 202/well tool 202A repurposed for creating the enclosed volume 226 therein. Alternatively, the closures (e.g., first closure 204a and second closure 204b) can be distinct from the tool 202/well tool 202A, for example as shown in FIG. 3, and selectively secured to the tool 202/well tool 202A by a user (automatically or manually) to create the enclosed volume 226.

While the first and second closures 204a/204b are circular in FIG. 1A, FIG. 1B, and FIG. 3, it will be appreciated by those of skill in the art and with the help of this disclosure that the closures (e.g., first closure/second closures 204a/204b) can have other shapes (e.g., square, triangular, oval, or octagonal shapes) in other examples in order to cooperate with tools 202/well tools 202A of other shapes. Likewise, although the tool 202/well tool 202A is depicted in FIG. 1A, FIG. 1B, and FIG. 3 to FIG. 5 as tubular, tools 202/well tools 202A come in a wide variety of shapes and configurations, and such tools have interior regions/volumes 224 for which it may be desirable to apply a coating. Consequently, the shape, location, and other characteristics of the enclosed volume 226 inside the tool 202/well tool 202A can vary widely depending on the type and configuration of the tool 202/well tool 202A. For example, and without limitation, the enclosed volume 226 can be relatively "long and skinny" or "long and narrow" which may be difficult to coat via traditional coating techniques. For example, and without limitation, the enclosed volume 226 can have an aspect ratio that is less than or equal to about 0.5, 0.05, or 0.005, wherein the aspect ratio is an average width W of the interior volume 224 divided by an average length L thereof. The process of creating the enclosed volume 226 (e.g., how the enclosed volume 226 is closed off from the external environment and other regions of the tool 202/well tool 202A) can also vary widely, depending on the geometry of the tool 202/well tool 202A and the configuration of passages, openings, etc., leading into and out of the tool 202/well tool 202A.

Referring back to FIG. 1A/FIG. 1B, after the enclosed volume 226 (e.g., deposition chamber(s)) is created inside the tool 202/well tool 202A, the coating system 200/well tool coating system 200A can apply one or more coatings of material to interior surfaces 229 inside the tool 202/well tool 202A using a fluid delivery system 208. The fluid delivery system 208 is coupled to sources 220 (e.g., tanks or containers) of gases and the enclosed volume 226 by conduit(s) or "delivery line" 228 (e.g., pipes, tubing, etc.). The fluid delivery system 208 can selectively couple the sources 220 of gases with the enclosed volume 226 to implement a surface coating process. The fluid delivery system 208 can include any suitable components, such as valves, manifolds, and conduits, for controlling fluid communication therethrough. The fluid delivery system 208 can deliver the gases through a valve or port in a first closure 204a (e.g., one or more first closures 204a) that allows the gases to enter the enclosed volume 226, while still otherwise closing off the enclosed volume 226 from the external environment. Alternatively, the fluid delivery system 208 can supply the gases to the enclosed volume 226 through other access valve(s), port(s) or the like in the body of the tool 202/well tool 202A.

With reference to FIG. 1A and FIG. 1B, a coating device or system 200/well tool coating device or system 200A according to this disclosure for coating a surface 229 of an interior region or volume 224 disposed within a housing or tool 202, wherein the interior volume 224 has an inlet 205 and an outlet 207 and extends through the housing, apparatus, or tool 202/well tool 202A such that the interior volume 224 is accessible from an exterior E of the housing, apparatus, or tool 202/well tool 202A via the inlet 205 and the outlet 207, can comprise: a first closure 204a fluidically coupled to a delivery line 228 and configured to sealingly engage with the inlet 205 to the interior volume 224 of the housing 202; a second closure 204b fluidically coupled to a vacuum line 227 and configured to sealingly engage with the outlet 207 from the interior volume 224 of the housing 202/well tool 202A; a plurality of (e.g., pressurized) reactant gas sources 220 comprising reactant gases for one or more surface coating processes and fluidically coupled to the delivery line 228; optionally, a plasma generator 210 configured to generate a plasma and fluidically coupled to the (or another) delivery line 228; and a pump 214 fluidically coupled to the vacuum line 227 and configured to create a vacuum in the interior volume 226, said vacuum effective to draw one or more reactant gases from the plurality of reactant gas sources 220 and optionally plasma from the plasma generator 210 into the interior volume 224 of the housing 202/well tool 202A via the delivery line 228 and inlet 205 such that, upon reaction of the one or more reactant gases, optionally in the presence of the plasma, a coating is formed on all or a portion of the surface 229 of the interior volume 224 of the housing, apparatus, or tool 202/well tool 202A. As described further hereinbelow, the coating device or system 200/well tool coating device or system 200A can further comprising an ion generator 222, configured for applying an atomic layer etching (ALE) process to the surface 229; a heating unit 218 in thermal communication with the housing, apparatus, or tool 202/well tool 202A and in electronic communication with a controller 206 to control heating of the housing, apparatus, or tool 202/well tool 202A; the controller 206 in communication with the plurality of reactant gas sources 220 and operable to control delivery of reactant gas to the interior volume 224 and supply a sequence of the reactant gases to the interior volume 224 of the housing, apparatus, or tool 202/well tool 202A to perform one or more surface coating processes or techniques on all or a portion of the interior volume 224; and/or a trap 212 upstream of the pump 214 and downstream of the housing or tool 202/well tool 202A, wherein the trap 212 is operable as a filter and/or a second auxiliary coating chamber.

For example, the trap 212 can be used as a filter prior to the pump 214. Alternatively or additionally, a trap 212 (e.g., from which 'filter element(s)' thereof have been removed) can be utilized as an auxiliary coating chamber. This auxiliary chamber can be utilized to coat additional 'pieces' of the housing, apparatus, or tool 202/well tool 202A, for example, when these pieces are individual elements small enough to fit into the trap (e.g., tool windows, valves, plugs, etc.). In such instances, the pieces can be inserted within the trap 212 for coating according to the methods described herein.

As detailed further hereinbelow, the one or more surface coating processes can comprise, without limitation, chemical vapor deposition (CVD), atomic layer deposition (ALD), or both. The coating device or system 200/well tool coating device or system 200A can be portable. In such embodiments, the coating device or system 200/well tool coating device or system 200A can further comprises a portable conveyance or hauler (e.g., trailer, skid, vehicle, etc.) configured to transport the coating device 200/well tool coating device or system 200A to a worksite (e.g., wellsite 100 of FIG. 2).

One example of a surface coating process that the coating system 200/well tool coating system 200A can apply to an interior surface 229 of the tool 202/well tool 202A is ALD. ALD generally involves four main steps that are repeated to deposit a coating of a desired thickness on a surface: (i) a first step involving introducing a first reactant gas R1 into an enclosed volume 226 containing a surface (e.g., interior surface 229 which may or may not already have a coating layer thereupon) such that at least some of the reactant gas chemically bonds with the surface (e.g., interior surface 229 which may or may not already have a coating layer thereupon) to form a reactive layer, (ii) a second step involving removing leftovers of the first reactant gas or gaseous byproducts produced during the first step from the enclosed volume 226, (iii) a third step involving introducing a second reactant gas into the enclosed volume 226 such that at least some of this second reactant gas bonds with the reactive layer from the first step to form a monolayer, and (iv) a fourth step involving removing leftovers of the second reactant gas or gaseous byproducts produced during the third step from the enclosed volume 226. Some or all of these steps can be repeated as many times as is required to obtain the desired number of coating layers and the desired thickness of each layer.

To implement an ALD process, the coating system 200/well tool coating system 200A includes at least a first reactant gas, a second reactant gas, and a buffer gas (e.g., an inert gas such as nitrogen gas). These are represented in FIGS. 1A/1B as reactant gas R1, reactant gas R2, and buffer gas B, respectively, stored in sources 220. Reactant gas R1 and buffer gas B can be used in the first step of the ALD process. The buffer gas B can be used alone in the second step of the ALD process (e.g., to purge the enclosed volume 226 of reactant gas R1). The reactant gas R2 and the buffer gas B can be used in the third step of the ALD process. The buffer gas B can again be used alone in the fourth step of the ALD process. While this example involves using the same buffer gas B throughout the steps, other examples can involve using different buffer gases for various steps. Still other examples may exclude the buffer gas B altogether in some of the steps (e.g., steps two and four) and/or use a pump 214 for performing these steps. For example, the well tool coating system 200 can include pump 214 (e.g., a vacuum pump) coupled to the enclosed volume 226 for suctioning reactant gases, gaseous byproducts, and/or buffer gases out of the enclosed volume 226 (e.g., in order to implement the second and fourth steps of the ALD process). Also referred to as a "buffer gas" B, the buffer gas B can be used as a 'carrier' gas for first reactant gas R1 and second reactant gas R2 in steps (1) and (3), respectively, and as a buffer for steps (2) and (4). The same or different buffer gas(es) B, e.g. nitrogen ($N_2$), can be utilized in steps (1) and/or (3) as in steps (2) and/or (4), The coating system 200/well tool coating system 200A can include any suitable combination of reactant gases and buffer gases for performing the ALD process. For example, the reactant gases R1-R2 can include trimethyl-aluminum and water, respectively, for producing coating layers of aluminum oxide inside the tool 202/well tool 202A. Alternatively, the reactant gases R1-R2 can form coatings of titanium dioxide, hafnium dioxide, zirconium dioxide, tantalum pentoxide, or other group IVB metal oxides and their silicate alloys, inside the tool 202/well tool 202A. In some examples, the buffer gas B can include nitrogen, helium, neon, xenon, argon, or any other inert gas that does not chemically react with the reactant gases and the surface 229 to be coated.

Still referring to FIGS. 1A/1B, another example of a surface coating process that the coating system 200/well tool coating system 200A can apply to an interior surface 229 of the tool 202/well tool 202A is CVD. CVD can generally involve introducing at least one reactant gas into an enclosed volume 226 such that it chemically reacts with a surface (e.g., interior surface 229 which may or may not already have a coating layer thereupon) inside the enclosed volume 226. In some examples, CVD can involve introducing two or more reactant gases simultaneously and continuously into the enclosed volume 226 such that they chemically react with a surface (e.g., interior surface 229 which may or may not already have a coating layer thereupon) inside the enclosed volume 226.

To implement the CVD process, the coating system 200/well tool coating system 200A can include at least a third reactant gas, which is represented in FIG. 1A/1B as reactant gas R3. The coating system 200/well tool coating system 200A may also include a fourth (or more) reactant gas for implementing the CVD process. The fourth reactant gas is represented in FIG. 1A/1B as R4. The third and fourth reactant gases R3/R4 can each include any suitable reactant gas for performing a CVD process. For example, the third reactant gas R3 or the fourth reactant gas R4 can be configured to form coatings of carbide, silicon carbide, or aluminum oxide inside the tool 202/well tool 202A. The third/fourth reactant gases R3/R4 are stored in sources 220, from which they can be supplied (e.g., via one or more delivery lines) to the enclosed volume 226 inside the tool 202/well tool 202A.

To control the surface coating processes, the coating system 200/well tool coating system 200A can include a controller 206 coupled to the fluid delivery system 208 by control lines 216. The controller 206 is a physical device that can operate the fluid delivery system 208 to control fluid flow into the enclosed volume 226 within the tool 202/well tool 202A. The controller 206 can be a mechanical controller, a hydraulic controller, an electrical controller, or any combination of these. In an example in which the controller 206 is a mechanical controller, the control lines 216 can be links or cables and the fluid delivery system 208 can include mechanically controlled pumps, valves, etc. In an example in which the controller 206 is a hydraulic controller, the control lines 216 can be hydraulic lines and the fluid delivery system 208 can include hydraulically controlled pumps, valves, etc. In an example in which the controller 206 is an electrical controller, the control lines 216 can be wires and the fluid delivery system 208 can include electrically controlled pumps, valves, etc.

In some examples, the controller 206 includes a processing device communicatively coupled to a memory device for executing control logic 230 stored on the memory device. Non-limiting examples of the processing device include a Field-Programmable Gate Array (FPGA), an application-specific integrated circuit (ASIC), a microprocessor, etc. The memory device can be non-volatile and may include any type of memory device that retains stored information when powered off. Non-limiting examples of the memory device include electrically erasable and programmable read-only memory (EEPROM), flash memory, or any other type of non-volatile memory. In some examples, at least some of the memory device can includes a non-transitory computer-readable medium, such as a magnetic disk, memory chip, read only memory (ROM), random-access memory (RAM), an ASIC, optical storage, or any other medium from which a computer processor can read the control logic 230, which can include program code for automating a sequence of steps for performing an ALD process, a CVD process, and/or any another surface coating process or processes.

The controller 206 can actuate the fluid delivery system 208 via the control lines 216 to implement the ALD process, the CVD process, and/or another surface coating process. For example, the controller 206 can sequentially actuate valves inside the fluid delivery system 208 such that first/second reactant gases R1/R2 flow from their sources 220 to the enclosed volume 226 in order to perform the ALD process. The controller 206 can simultaneously actuate valves inside the fluid delivery system 208 such that third/fourth reactant gases R3/R4 flow from their sources 220 to the enclosed volume 226 in order to perform the CVD process. The controller 206 may further control a pump 214 (e.g., a vacuum pump), which can suction gases (e.g., reactant gases, buffer gases, byproduct gases) out of the tool 202/well tool 202A and through a trap 212 that serves as a filter. Alternatively, the pump 214 can be separately controlled independently of the controller 206.

The coating system 200/well tool coating system 200A can include other components as well. For example, the coating system 200/well tool coating system 200A can include a plasma generator 210 coupled to the controller 206, which can operate the plasma generator 210 to assist in performing a surface coating process. The plasma generator 210 can convert reactant and/or inert or otherwise non-reactive gases into plasmas for performing a surface coating process. This may enable surface coating to occur under a wider range of ambient conditions (e.g., temperatures and pressures) inside the enclosed volume 226 as compared to a thermal approach. The presence of plasma may also enable a wider range of material properties to be realized as compared to a thermal approach employing other sources of heat (e.g., via heating unit 218). In some examples, the plasma generator 210 includes a glass or quartz tube that serves as a plasma chamber and electrodes positioned within the plasma chamber. A direct current (DC) voltage can then be applied to the electrodes that causes reactant gases (e.g., hydrogen, oxygen, ammonia, or silane) flowing therethrough to be converted into plasmas, which are then introduced into the enclosed volume 226. The properties of the plasmas can be tuned by adjusting the spacing between the electrodes, the applied voltage, and the pressure inside the plasma chamber. In some examples, the plasma generator 210 can generate microwave plasmas, electron cyclotron resonance plasmas, or radio-frequency driven inductively coupled plasmas.

Additionally or alternatively, the coating system 200/well tool coating system 200A can include a heating unit 218 coupled to the controller 206, which can operate the heating unit 218 as part of performing a surface coating process. One example of the heating unit 218 can be an oven or heating jacket, which can receive the tool 202/well tool 202A and apply thermal energy to the tool 202/well tool 202A in order to assist in performing a surface coating process.

The coating system 200/well tool coating system 200A may further include a solvent, an oxidizer, or both. These are represented in FIG. 1A/1B as solvent S and oxidizer O. The solvent is a substance that can dissolve another substance. Examples of solvents include toluene, xylene, benzene, carbon tetrachloride, tetrahydrofuran, dichloromethane, and d-limonene. The oxidizer is a substance that can oxidize another substance (e.g., cause the other substance to lose electrons). Examples of oxidizers include sulfur and nitrous oxide. The coating system 200/well tool coating system 200A can operate the fluid delivery system 208 to flush the enclosed volume 226 inside the housing, apparatus, or tool 202/well tool 202A with solvent S, the oxidizer O, or both. The coating system 200/well tool coating system 200A may flush the enclosed volume 226 with one or both of these prior to performing a surface coating process in the enclosed volume 226. This can prepare the enclosed volume 226 for the surface coating process and help promote bonding.

In some examples, the coating system 200/well tool coating system 200A further includes one or more topical reagents. These are represented in FIG. 1A/1B as topical reagents TR. A topical reagent is a substance configured to chemically react with a coating layer deposited inside the enclosed volume 226 in order to change a material characteristic of the coating layer. Examples of material characteristics can include wettability, stiffness, strength, ductility, hardness, density, electrical conductivity, thermal conductivity, and corrosion resistance. The coating system 200/well tool coating system 200A can operate the fluid delivery system 208 to apply the topical reagent TR to one or more coating layers inside the tool 202/well tool 202A, thereby adjusting one or more material characteristics of the coating layer(s). As a particular example, the coating system 200/well tool coating system 200A can apply a topical reagent TR that includes hydrochloric acid to a coating layer inside the tool 202/well tool 202A. If the coating layer is formed from hydrogen, the hydrochloric acid can burn off at least some of the hydrogen to improve the wettability of the coating layer.

The coating system 200/well tool coating system 200A can also include one or more etching gases EG and an ion generator 222 for applying an atomic layer etching (ALE) process inside the tool 202/well tool 202A. ALE can be viewed as the reverse of the layer deposition process of ALD, in the sense that ALE uses sequential and self-limiting reactions to remove thin layers of material from a surface. The coating system 200/well tool coating system 200A can operate the fluid delivery system 208 to apply the ALE process, for example, in order to pre-treat the enclosed volume 226 prior to a surface coating process or to reduce the thickness of a coating layer resulting from a surface coating process.

ALE generally involves four main steps that are repeated: (i) a first step involving applying an etching gas EG to a surface in an enclosed volume 226 such that the surface chemically reacts with and adsorbs the etching gas, and (ii) a second step involving purging the etching gas EG and any gaseous byproducts resulting from the first step from the enclosed volume 226, (iii) a third step involving applying low-energy ions to the portions of the surface that chemically reacted with the etching gas EG in order to etch away (e.g., remove) those portions, and (iv) a fourth step involving purging byproducts resulting from the third step. The controller 206 can implement the first step by actuating the fluid delivery system 208 to supply the etching gas EG from a source 220 to within the enclosed volume 226. Examples of the etching gas EG can include argon, fluorine, chlorine, boron trichloride, and hydrogen bromide. The controller 206 can implement the second and fourth steps by actuating the pump 214, actuating the fluid delivery system 208 to supply a buffer gas (e.g., buffer gas B) to within the enclosed volume 226, or both of these. The controller 206 can implement the third step by actuating an ion generator 222, which can supply the low-energy ions to the enclosed volume 226. Some or all of these steps can be repeated as many times as is required.

While the coating system 200/well tool coating system 200A shown in FIG. 1A/1B includes a certain amount and arrangement of components for illustrative purposes, other examples can include more, fewer, or a different arrangement of these components. For example, the coating system 200/well tool coating system 200A can include more or fewer control lines, conduits (e.g., delivery lines), reactant gases, buffer gases, topical reagents, solvents, oxides, etching gases, or any combination of these. In one such example, the coating system 200/well tool coating system 200A only includes three reactant gases (e.g., first reactant gas R1, second reactant gas R2, and third reactant gas R3), whereby at least one of the three reactant gases (e.g., second reactant gas R2) is common to at least two surface coating processes. Also, some examples may exclude the controller 206, the plasma generator 210, the trap 212, the pump 214, the heating unit 218, the ion generator 222, or any combination of these. Further, while some examples above are described in relation to ALD and/or CVD, other examples can involve other types and combinations of surface coating processes.

Figure 4:
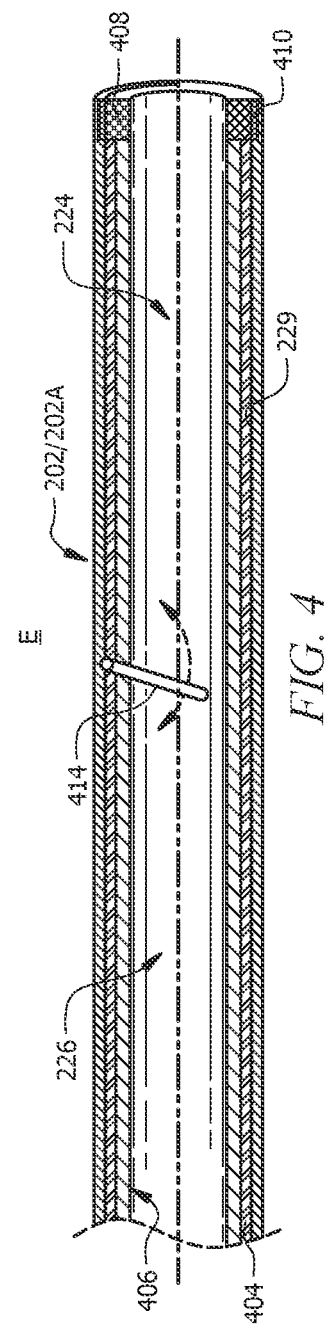
FIG. 4 is a cross-sectional side view of an example of a tool (e.g., a well tool) with coatings according to some aspects.

One example of the tool 202/well tool 202A after applying various coatings is shown in FIG. 4, which depicts a partial view of the tool 202/well tool 202A comprising a cylindrical housing having an interior surface 229. In FIG. 4, the tool 202/well tool 202A includes an enclosed volume 226 with coatings deposited using different types of surface coating processes. In one example, the coatings include a base layer 404 deposited onto interior surface 229 during a CVD process to improve bonding with another coating layer 406 deposited onto layer 404 during an ALD process. In another example, the coatings include a base layer 404 deposited onto interior surface 229 during an ALD process to improve bonding with another coating layer 406 deposited onto layer 404 during a CVD process. Other examples can involve any number and combination of coatings deposited (e.g., sequentially deposited to build up a plurality of layers providing a desired coating thickness) using any number and combination of surface coating processes. The base layer 404 can be deposited directly onto an uncoated interior surface 229, optionally after cleaning and/or etching (e.g., ALE) thereof.

Still with reference to FIG. 4, a cover 408 can be positioned inside the enclosed volume 226 to prevent a surface coating process from being applied to a part 410 (e.g., a length or section) of the interior surface 229 of tool 202/well tool 202A. In some examples, the cover 408 can include a metal plate or ring disposed over one or more grooves, collets, threads, or ridges inside the tool 202/well tool 202A to prevent one or more surface coating processes from being applied thereto. For example, the cover 408 can be positioned to protect one or more threads at one or more ends of the tool 202/well tool 202A from being damaged.

In some examples, the interior region or volume 224 of the tool 202/well tool 202A can include a movable part 414. Examples of the movable part 414 can include a flap, valve, port, latch, pump, motor, tubular, ball, sleeve, piston, spring, seat, or any other component configured to rotate, pivot, translate, or otherwise move inside the enclosed volume 226. The movable part 414 can be actuated during a surface coating process, for example, to ensure that one or more coatings are adequately applied to the movable part 414. For example, a controller (e.g., controller 206 of FIG. 2) can actuate the movable part 414 between at least two positions during an ALD process, a CVD process, or both. In one example in which the movable part 414 is a valve or port, the at least two positions can include an open position and a closed position. In one example in which the movable part 414 is a latch, the at least two positions can include a latched position and an unlatched position. In one example in which the movable part 414 is a flap, the at least two positions can include various pivot angles. Any number and combination of movable parts can be actuated between any number and combination of positions within the enclosed volume 226. By actuating the movable part during or between coatings, an entire surface of the movable part 410 that will come into contact with a fluid that can potentially be corrosive or otherwise interfere with the tool 202/well tool 202A (e.g., interfere with a measurement obtained with the tool 202/wellbore tool 202A) can be coated during the coating process. The movable part can be a sample probe (40, as described further hereinbelow with reference to FIG. 6), that can be coated in both an extended and a retracted configuration relative to a well tool 202A.

Figure 5:
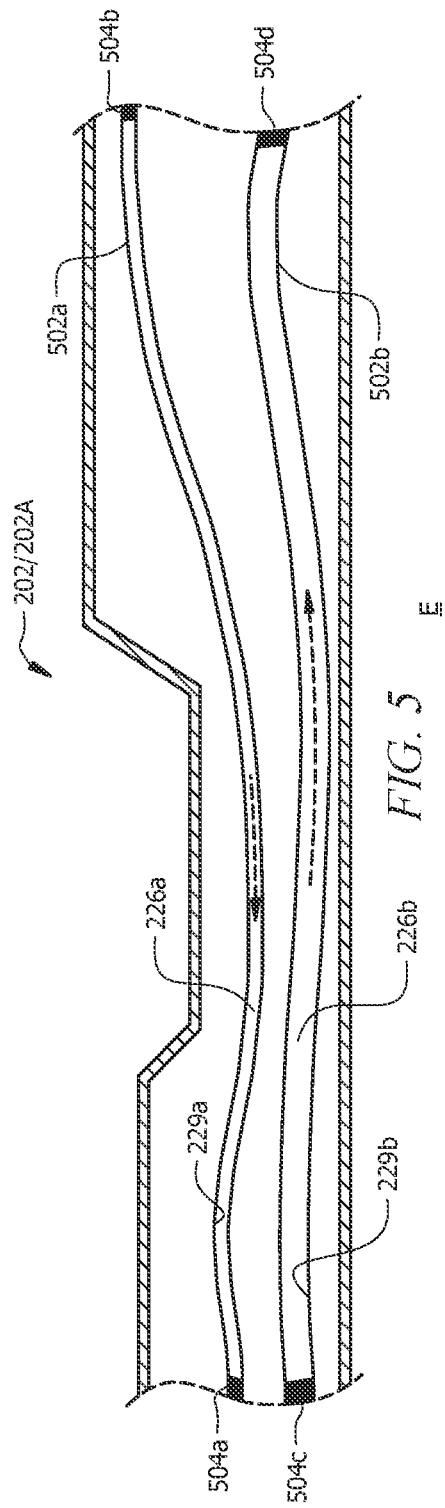
FIG. 5 is a partial view of another example of a tool (e.g., a well tool) having multiple deposition chambers according to some aspects.

FIG. 5 is a partial view of another example of a tool 202/well tool 202A having multiple passages (e.g., first passage 502a and second passage 502b) therethrough. In one example, the passages (e.g., first passage 502a and second passage 502b) are for providing different types of fluid to tool 202/well tool 202A (e.g., downhole to a well tool 202A) and from tool 202/well tool 202A (e.g., from a well tool 202A to the well surface 108 (FIG. 2)). The passages (e.g., first passage 502a and second passage 502b) can be enclosed by closures 504a-d (e.g., including first closure 504a, second closure 504b, third closure 504c, and fourth closure 504d), thereby forming multiple enclosed volumes inside the passages (e.g., first enclosed volume 226a and second enclosed volume 226b). One or more surface coating processes can then be applied by the coating system 200/well tool coating system 200A to the passages (e.g., first passage 502a and/or second passage 502b) to coat them with layers of material. In the embodiment of FIG. 5, first closure 504a and second closure 504b seal off passage 502a to provide first enclosed volume (or first deposition chamber) 226a and third closure 504c and fourth closure 504d seal off passage 502b to provide second enclosed volume (or second deposition chamber) 226b. The interior surface 229a of first enclosed volume 226a and the interior surface 229b of second enclosed volume 226b can be coated simultaneously and/or sequentially utilizing the same or different coating processes (e.g., ALD and/or CVD), depending on the fluids to which the interior surfaces are expected to be exposed during operation of the tool 202/well tool 202A during operation.

As noted hereinabove, a housing, apparatus, or tool 202/well tool 202A coated via the coating system 200 of this disclosure can comprise any apparatus, housing, or tool 202 for which a coating on an interior surface 229 thereof is desired. For example, and without limitation, the housing, apparatus, or tool 202 can comprise a furnace tube, an aircraft component (e.g., a wing, a fuselage), a component of a water supply/treatment system; a component of a vehicle fuel system; a well tool 202A; a heat exchanger or component thereof such as a shell or plurality of tubes; a pump or component thereof such as a suction or discharge chamber; a reactor or component thereof such as a vessel, manifold, catalyst bed, injector, feed and/or discharge conduit; a distillation column or component thereof such as valves or trays; a condenser or component thereof such as a housing or condenser tubes; a reboiler or component thereof such as a housing or heating tubes; an interior volume of a storage vessel; an interior volume of a transportation vessel (e.g., a fluid transport trailer pulled by a semi truck); or another housing, apparatus, or tool 202/well tool 202A.

In some embodiments, housing, apparatus, or tool 202 comprises a well tool 202A, and the coating system 200 is referred to herein as a well tool coating system 200A. For example, and without limitation, the well tool 202A can comprise a logging tool or a wireline tool. For example, and without limitation, the well tool 202A can be a drilling tool, such as, without limitation, a logging while drilling (LWD) tool, a measurements while drilling (MWD) tool, or a sampling while drilling (SWD) tool. In some such embodiments, the interior volume or region 224 of the well tool 202A comprises a fluid flow path (or "flow passage") configured for flow of a formation fluid from an exterior E of the well tool 202A through an interior (e.g., interior volume 224) of the well tool 202A.

Figure 6:
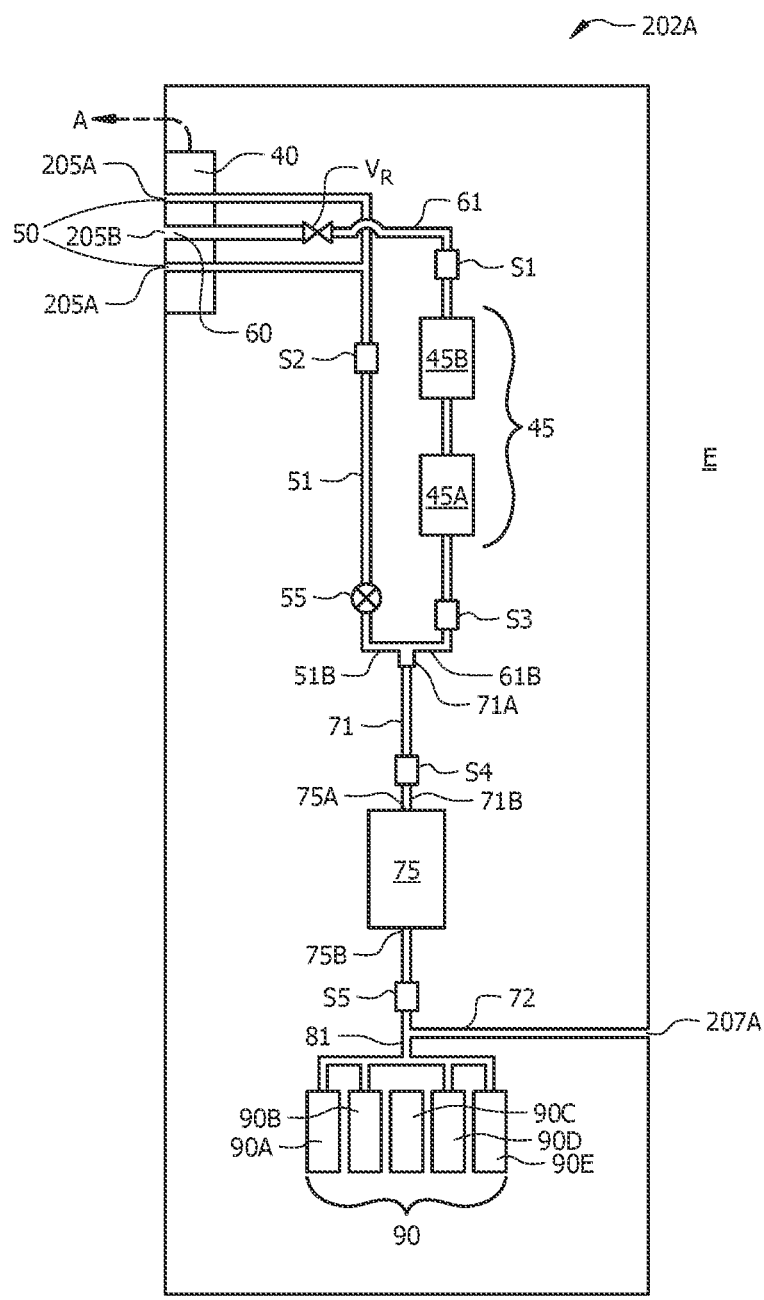
FIG. 6 is a schematic diagram of an example of a well tool that can be coated via the well tool coating system according to some aspects.

In embodiments, a well tool 202A having an interior surface 229 coated via the well tool coating system 200A of this disclosure is a sampling tool, such as a focused sampling tool. FIG. 6 is a schematic diagram of an exemplary focused sampling well tool 202A that can be coated via the well tool coating system 200A according to some aspects. Well tool 202A of FIG. 6 is a focused sampling well tool operable to take one or more fluid samples having a composition representative of a virgin formation fluid in formation 104 (FIG. 2) in one or more sample chambers 90 (with five sample chambers, including first sample chamber 90A, second sample chamber 90B, third sample chamber 90C, fourth sample chamber 90D, and fifth sample chamber 90E depicted in the embodiment of FIG. 6) from within the formation 104 (FIG. 2). A well tool 202A can comprise a sample line 61; a guard line 51; a common line 71; a pump 75; a discard line 72; a sampling line 81; the one or more sample chambers 90; one or more fluid ID sensors S positioned on the guard line, the sample line, the common line, or a combination thereof (with first fluid ID sensor S1 and third fluid ID sensor S3 depicted on sample line 61, second fluid ID sensor S2 depicted on guard line 51, fourth fluid ID sensor S4 depicted on common line 71, and fifth fluid ID sensor S5 depicted on pump outlet line 76); and a flow restrictor 55.

Sample line 61 has a sample line inlet 205B and a sample line outlet 61B. Guard line 51 has a guard line inlet 205A and a guard line outlet 51B. As depicted in the embodiment of FIG. 6, a focused sampling well tool 202A of this disclosure can comprise one or a plurality of lines that extend from guard line inlets 205A thereof and merge to form a single guard line 51 toward guard line outlet 51B. This configuration of guard line is intended to be included in the term "guard line(s) 51". In embodiments, the guard line(s) 51 is configured for a higher fluid flow rate $Q_G$ than a fluid flow rate $Q_S$ of the sample line 61. Common line 71 has a common line inlet 71A and a common line outlet 71B, and is fluidly connected with the sample line outlet 61B and the guard line outlet 51B, for example at a tee or Y junction. Pump 75 has a suction side inlet 75A and a discharge side outlet 75B. Suction side inlet 75A of pump 75 is fluidly connected with common line outlet 71B and discharge side outlet 75B of pump 75 is fluidly connected with discard line 72 and sampling line 81, for example via a tee or Y junction. Discard line 72 has a discard line outlet 207A. In embodiments, focused sampling tool 202A of this disclosure comprises a single pump 75, whereby fluid is pulled into the well tool 202A via a common pump (e.g., single pump 75) and a common suction line (e.g., common line 71). Sampling line 81 is fluidly connected with the one or more sample chambers 90.

Flow restrictor 55 is operable to prevent flow of fluid from guard line 51 to common line 71 in a first (e.g., closed) configuration and allow flow of fluid from the guard line 51 to the common line 71 in a second (e.g., open) configuration. In embodiments, flow restrictor 55 is a shutoff valve. In embodiments, sample line 61 has a flow restrictor thereupon, such as restrictor valve VR, that is operable as a shutoff valve that can be actuated to prevent fluid flow through sample line 61. In some such embodiments, a separate restrictor 55 may not be present. Flow restrictor 55 can be a check valve. Restrictor 55 can be positioned on guard line 51 upstream of guard line outlet 51B. Sample line 61 can comprise a check valve upstream of sample line outlet 61B, in embodiments.

A focused sampling well tool 202A of this disclosure can further comprise a probe 40 that can extend from well tool 202A during formation sampling (as indicated by arrow A in FIG. 6) and define a sample zone 60 fluidly connected with the sample line inlet 205B of the sample line 61, a guard zone 50 fluidly connected with the guard line inlet 205A of the guard line 51, or both a sample zone 60 fluidly connected with the sample line inlet 205B of the sample line 61 and a guard zone 50 fluidly connected with the guard line inlets 205A of the guard line 51. For example, focused sampling well tool 202A of the embodiment of FIG. 6 further comprises probe 40 defining sample zone 60 fluidly connected with the sample line inlet 205B of the sample line 61, and guard zone 50 fluidly connected with the guard line inlets 205A of the guard line 51. The guard zone 50 and the sample zone 60 are in fluid communication with the subsurface formation 104 (FIG. 2), during operation of the focused sampling well tool 202A.

The comparative flow rate $Q_G$ in the guard line(s) 51 from guard zone(s) 50 and flow rate $Q_S$ in the sample line 61 from sample zone 60 can be represented by a ratio of flow rates $Q_G/Q_S$. (The flow rate into the sample line 61 from the sample zone is represented by $Q_S$, and is also referred to herein as the flow rate in the sample zone, and the flow rate into the guard line(s) from the guard zone(s) 50 is represented by $Q_G$, and is also referred to herein as the flow rate in the guard zone(s).) The flow rate $Q_S$ in the sample line 61 from sample zone 60 may be selectively increased and/or the flow rate $Q_G$ in the guard line(s) 51 from guard zone(s) 50 may be decreased to allow more fluid to be drawn into the sample zone 60. Alternatively, the flow rate $Q_S$ in the sample line 61 from sample zone 60 may be selectively decreased and/or the flow rate $Q_G$ in the guard line(s) 51 from guard zone(s) 50 may be increased to allow less fluid to be drawn into the sample line 61 via sample zone 60. A focused sampling tool 202A can comprise a single pump 75, a restrictor valve 55 and/or diameter of sample line 61 and/or guard line(s) 51 can be selected to provide the desired ratio $Q_G/Q_S$ of fluid flow rate in the guard zone(s) 50 to the fluid flow rate in the sample zone 60. In alternative configurations, focused sampling tool 202A can comprise two or more pumps, for example a first pump coupled to sample line 61 and one or more additional pumps coupled to guard line(s) 51, whereby the two or more pumps can be operated independently to provide to provide the desired ratio $Q_G/Q_S$ of fluid flow rate in the guard zone(s) 50 to the fluid flow rate in the sample zone 60.

A focused sampling well tool 202A can further comprise one or more dead volumes 45 in fluid communication with the sample line 61. The one or more dead volumes 45 can be online or offline dead volumes, meaning fluid in sample line 61 flows through the one or more dead volumes ("online") or does not flow through the one or more dead volumes ("offline") during a pre-sampling time period. As depicted in FIG. 6, the one or more dead volumes 45 can include a first dead volume 45A and a second dead volume 45B in series along the sample line 61. The one or more dead volumes 45 provide a total dead volume $V_{TOT}$. In embodiments, the total dead volume $V_{TOT}$ is greater than or equal to a total sample volume of the one or more sample chambers 90.

Focused sampling well tool 202A can be operated to take one or more fluid samples (in the one or more sample chambers 90) from formation 104, wherein the one or more fluid samples have a composition approximating that of a virgin formation fluid in formation 104.

Well tool coating system 200A can be utilized to coat an interior surface 229 extending from guard line inlet 205A and guard line 50 and/or from sample line inlet 205B and sample line 61 to discard line outlet 72. For example, well tool coating system 200A can be utilized to coat an interior surface 229 extending from guard line inlet 205A and guard line 50 and/or from sample line inlet 205B and sample line 61; optionally through the one or more dead volumes 45 (e.g., first dead volume 45A and second dead volume 45B);

through common line 71, pump 75, optionally sampling line 81, and discard line 72; to discard line outlet 207A. Closures can be positioned on guard line inlets 205A and sample line inlet 205B and on discard line outlet 207A, and surface coating (e.g., ALD and/or CVD) performed on all or a portion of the resulting enclosed volume 226 therebetween. During the forming of the coating, probe 40 can be extended from a retracted initial position or retracted from an extended initial position (e.g., respectively along or away from the direction indicated by arrow A) to ensure that an entire interior surface 229 that will be exposed to formation fluid during formation sampling can be coated. For example, the probe 40 may have telescoping portions of sample line inlet 205B and guard line inlets 205A that may be extended and coated to ensure complete coating of the entire flow path that will be in contact with the formation fluid during sampling.

Figure 7:
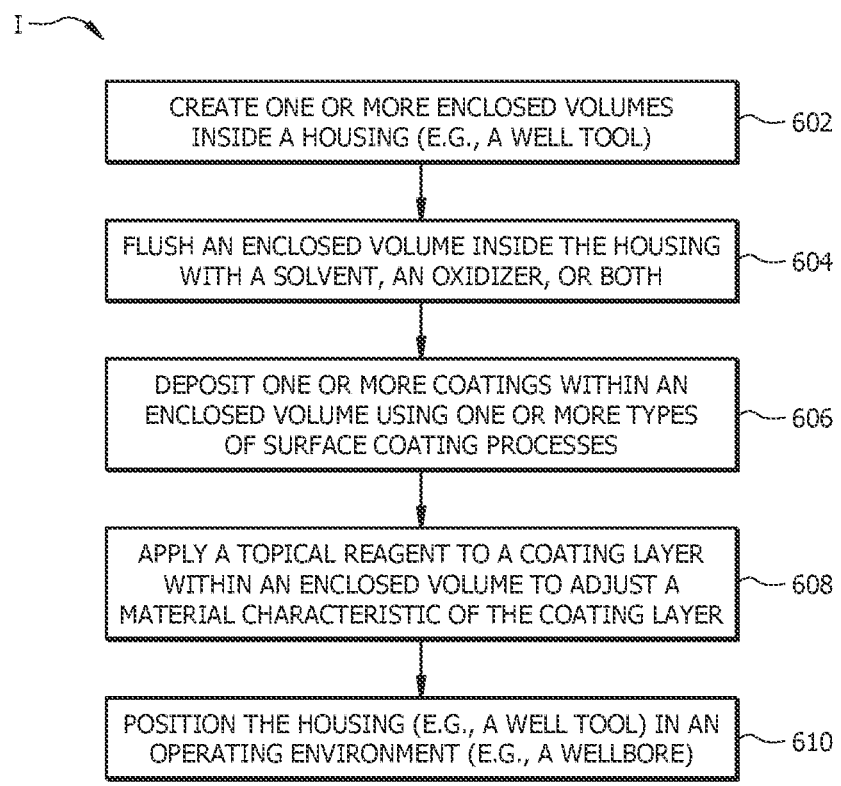
FIG. 7 is a flow chart of an example of a process for depositing coatings within housings, apparatus, or tools (e.g., well tools) according to some aspects.

In some examples, one or more coatings can be applied within a tool 202/well tool 202A in accordance with the process I shown in FIG. 7. Other examples can include more steps, fewer steps, different steps, or a different order of the steps than is shown in FIG. 7. The steps of FIG. 7 are discussed below with reference to the components discussed above in relation to FIGS. 1-6.

In block 602, one or more enclosed volumes 226 are created inside the tool 202/well tool 202A. This may involve closing off one or more passages (e.g., first passage 502a, second passage 502b of FIG. 5) through the tool 202/well tool 202A by attaching closures (e.g., first closure 204a, and second closure 204b of FIG. 1A, FIG. 1B, and FIG. 3, first closure 504a, second closure 504b, third closure 504c, fourth closure 504d of FIG. 5) to the ends of the housing, apparatus, or tool 202/well tool 202A to form one or more enclosed volumes 226/226a/226b continuously spanning a length (e.g., the entire length) of an interior volume 224 of the tool 202/well tool 202A. Alternatively, this may involve closing off one or more passages through just a subpart of the tool 202/well tool 202A by attaching the closures (e.g., first closure 204a, and second closure 204b of FIG. 1A, FIG. 1B, and FIG. 3, first closure 504a, second closure 504b, third closure 504c, fourth closure 504d of FIG. 5) to the ends of the subpart, thereby creating one or more enclosed volumes 226 continuously spanning only the length of an interior volume 224 of the subpart. That is, the closures need not be attached to the axial or radial ends or edges of the tool 202/well tool 202A (e.g., the threaded terminal ends of the tool 202/well tool 202A that may couple with additional components such as a conveyance (e.g., drillpipe coupled to well tool 202A) or additional components of a downhole tool (e.g., additional components of a bottom hole assembly comprising a focused sampling well tool 202A) to form the one or more enclosed volumes 226/226a/226b, but rather extend from one end of the passage to another end of the passage, which passage need not continuously span the entire length or width of the tool 202/well tool 202A, but can extend from an inlet 205 at a first location anywhere along a length of the tool 202/well tool 202A to an outlet 207 at a second (different) location anywhere along a length of the tool 202/well tool 202A. After forming the enclosed volume(s) 226, heat and/or pressure can be applied to the enclosed volume(s) 226 to create ambient conditions inside the enclosed volume(s) 226 that are conducive to one or more surface coating processes, such as ALD or CVD. For example, the pump 214 can pressurize the enclosed volume(s) 226 to create suitable ambient conditions inside the enclosed volume(s) 226 to perform one or more surface coating processes as described herein. Alternatively, the pump 214 can be used to evacuate all or portion of the enclosed volume 226, for example to aid in the introduction of one or more coating process gases to the enclosed volume 224. For example, heating unit 218 can be used to control the temperature (e.g., heat) of the enclosed volume 226 to create suitable ambient conditions inside the enclosed volume(s) 226 to perform one or more surface coating processes as described herein. In block 604, a coating system 200/well tool coating system 200A flushes an enclosed volume 226 with a solvent S, an oxidizer O, or both. For example, the controller 206 can operate the fluid delivery system 208 to provide sequential or simultaneous flow of the solvent S, the oxidizer O, or both into the enclosed volume 226. This may help to prepare the enclosed volume 226 for one or more surface coating processes.

In block 606, the coating system 200/well tool coating system 200A deposits one or more coatings within an enclosed volume 226 using one or more types of surface coating processes. For example, the controller 206 can operate the fluid delivery system 208 to provide sequential or simultaneous flow of reactant gases into the enclosed volume 226 in accordance with an ALD process, a CVD process, or both to deposit the coatings. In other examples, the controller 206 can operate the fluid delivery system 208 to provide sequential or simultaneous flow of reactant gases into the enclosed volume 226 in accordance with one or more other types of surface coating processes to deposit the coatings. In embodiments, one or more of the reactant gases can be provided as a plasma produced in plasma generator 210.

As noted at block 602, the enclosed volume 226 can be configured to have certain ambient conditions that are more conducive to a surface coating process. For example, the enclosed volume 226 can be pressurized within a particular range configured to produce viscous flow (rather than molecular flow) of fluids therein, such as the reactant gases or buffer gases. Viscous flow is characterized by a Knudsen number, which is a dimensionless quantity of mean free path divided by a diameter of the flow channel (e.g., the enclosed volume 226). Knudsen numbers less than 0.01 characterize viscous flow, whereas Knudsen numbers higher than 0.01 characterize molecular flow. There is an inverse relationship between mean free path and pressure. Based on these factors, the enclosed volume 226 can be pressurized to achieve viscous flow. For instance, a flow channel with a diameter of 0.5 centimeters (cm) yields a Knudsen number of about 0.001 for nitrogen gas pressurized to 10 Torr. Decreasing the pressure to 1 Torr yields a Knudsen number of 0.01. Any further decrease in the pressure below 1 Torr could further increase the mean free path and push the Knudsen number beyond the viscous flow regime and towards molecular flow. Thus, this flow channel can be pressurized between 1-10 Torr to achieve viscous flow.

Additionally or alternatively, the enclosed volume 226 can be configured to produce laminar flow (as opposed to turbulent flow) of the fluids therein. Laminar flow can be achieved by configuring the enclosed volume 226 to have a Reynolds number that is less than 2300. The Reynolds number is defined as the flow rate of the fluid times the diameter of the enclosed volume 226, divided by the kinematic viscosity of the fluid and the cross-sectional area of the enclosed volume 226. Thus, in an example in which the diameter of the enclosed volume 226 is 0.56 cm and the kinematic viscosity for the fluid is $1.5*10^{-5}$ (m$^2$/s), the upper bound on the flow rate can be set to 150-200 scm to ensure laminar flow.

Additionally or alternatively, reactant-gas dosing and purge times can be configured to optimize saturation (e.g., self-limiting growth) during a surface coating process, while not wasting excess reactant gas or deposition time. For example, reactant-gas dosing times may range from 0.1 s to 1.0 s, and purging times may range from 5.0 s-10.0 s. This can result in relatively constant ALD growth per cycle, even when more reactant gas is added to the enclosed volume 226 or the purge time is extended.

In block 608, the coating system 200 (e.g., well tool coating system 200A) applies a topical reagent TR to a coating layer within an enclosed volume 226 to adjust a material characteristic of the coating layer. The coating layer may be an uppermost coating layer in the enclosed volume 226. For example, the controller 206 can operate the fluid delivery system 208 to provide sequential or simultaneous flow of the topical reagent TR into the enclosed volume 226 to adjust a material characteristic of coating layer 406. In some processes, applying a topical reagent TR at block 608 may be optional or not required where a material characteristic of an uppermost coating layer does not need adjustment. In some processes, applying a topical reagent TR at block 608 may be performed between on or more layers other than the uppermost coating layer. For example, a topical reagent may be applied after an ALD coating layer is applied and before a CVD coating layer is applied; a topical reagent may be applied after a CVD coating layer is applied and before an ALD coating layer is applied, or combinations thereof Some or all of the above steps can be performed at a worksite or jobsite, such as, for example and without limitation, a wellsite 100. For example, the well tool coating system 200A can be positioned at the wellsite 100 for performing steps 602-608 after delivery of the well tool 202A to the wellsite 100 and prior to positioning the well tool 202A downhole. Some or all of the above steps can also be repeated, for example, in instances where there are multiple enclosed volumes inside the well tool 202A. Some or all of the above steps can also be repeated, for example, in instances where a well tool 202A is recovered from being deployed downhole, and while downhole an interior surface of the well tool 202A was exposed to formation fluid, wherein the process as depicted in FIG. 7 can be used to coat and/or re-coat all or a portion of the interior surface of the well tool 202A that was exposed to the formation fluid.

In block 610, the tool 202/well tool 202A is positioned in an operating environment. For example, when housing, apparatus, or tool 202 comprises a well tool 202A, block 610 can comprise positioning the well tool 202A in the wellbore 102 (FIG. 2). For example, the well tool 202A can be positioned downhole using any suitable type of conveyance, such as a drillpipe, wireline, slickline, or coiled tubing. The tool 202/well tool 202A can then be utilized to perform one or more operations. For example, the well tool 202A can then be used to perform one or more downhole operations, such as, without limitation, formation fluid sampling.

In aspects, a method of coating a surface 229 of an interior region or volume 224 of a housing 202, wherein the interior volume 224 has an inlet 205 and an outlet 207, comprises: positioning the coating device or system 200 as described hereinabove and the housing, apparatus, or tool 202/well tool 202A proximate each other; sealingly engaging the first closure 204a to the inlet 205 of the interior volume 224 of the housing, apparatus, or tool 202/well tool 202A and sealingly engaging the second closure 204b to the outlet 207 of the interior volume 224 of the housing, apparatus, or tool 202/well tool 202A to provide enclosed interior volume 226; activating the pump 214 to create a vacuum in the enclosed interior volume 226 of the housing 202; drawing by the vacuum one or more of the reactant gases from the plurality of reactant gas sources 220, plasma from the plasma generator 210, or both into the enclosed interior volume 226 of the housing, apparatus, or tool 202/well tool 202A via the delivery line 228 and inlet 205; and forming one or more coating layers (e.g., base layer 404 and another coating layer 406) on all or a portion of the surface 229 of the interior volume 224 of the housing, apparatus, or tool 202/well tool 202A via reaction of the one or more reactant gases, optionally in the presence of the plasma.

In aspects, a method of coating a surface 229 of an interior volume or region 224 of a housing 202, wherein the interior volume or region 224 has an inlet 205 and an outlet 207, comprises: enclosing all or a portion of the interior volume 224 of the housing, apparatus, or tool 202/well tool 202A to yield an enclosed volume 226; introducing one or more reactant gases, plasma, or both to the enclosed volume 226; and forming one or more coating layers (e.g., base layer 404 and another coating layer 406 of FIG. 4) on all or a portion of the surface 229 of the enclosed interior volume 226 of the housing, apparatus, or tool 202/well tool 202A via reaction of the reactant gases, optionally in the presence of the plasma.

The interior volume 224/enclosed interior volume 226 can comprise a fluid flow path of the tool, apparatus, or housing, apparatus, or tool 202/well tool 202A.

As detailed hereinabove, the reaction can comprise a chemical vapor deposition (CVD) reaction, an atomic layer deposition (ALD) reaction, or both. For example, in embodiments, the method can further comprise: forming an ALD layer by: (i) introducing a first reactant gas R1 into the enclosed volume 226, such that at least a portion of the first reactant gas R1 chemically bonds with the surface 229 to form a reactive layer; (ii) removing unreacted first reactant gas R1 and/or gaseous byproducts from the enclosed volume 226; (iii) introducing a second reactant gas R2 into the enclosed volume 226, such that at least some of the second reactant gas R2 bonds with the reactive layer to form an ALD layer; and (iv) removing unreacted second reactant gas R2 and/or gaseous byproducts from the enclosed volume 226. Some combination of (i) through (iv) may be utilized to form the ALD layer. For example, not all of (i) to (iv) need be utilized during the forming of the ALD layer (e.g., removing unreacted second reactant gas R2 and/or gaseous byproducts from the enclosed volume 226 at (iv) may be absent).

For example and with reference now to FIG. 1A and FIG. 1B, forming an ALD layer can comprise (i) introducing a first reactant gas R1 from source 220 of reactant gas R1 into the enclosed volume 226, such that at least a portion of the first reactant gas R1 chemically bonds with the surface 229 to form a reactive layer. Controller 206 can be utilized to control the formation of the reactant layer. Forming the ALD layer can further comprise (ii) removing unreacted first reactant gas R1 and/or gaseous byproducts from the enclosed volume 226. Removing unreacted first reactant gas R1 and/or gaseous byproducts from the enclosed volume 226 can comprise pumping via pump 214 unreacted first reactant gas R1 and/or gaseous byproducts out of enclosed volume 226 via vacuum line 227 and optionally trap 212, and/or introducing buffer B from a buffer source 220 into enclosed volume 226. Controller 206 can be utilized to control the removal of unreacted first reactant gas R1 and/or gaseous byproducts from the enclosed volume 226. Forming the ALD layer can further comprise (iii) introducing a second reactant gas R2 from a source 220 of the second reactant gas R2 into the enclosed volume 226, such that at least some of the second reactant gas R2 bonds with the reactive layer to form an ALD layer. Controller 206 can be utilized to control the introducing of the second reactant gas R2 from the source 220 of the second reactant gas R2 into the enclosed volume 226. Forming the ALD layer can further comprise (iv) removing unreacted second reactant gas R2 and/or gaseous byproducts from the enclosed volume 226. Steps (i) through (iv) of forming an ALD layer can be repeated to obtain a desired number of ALD coatings and a desired thickness of each coating within the ALD layer. During one or more of steps (i) through (iv) of forming the ALD layer, heating unit 218 can be operated to provide a desired temperature within enclosed volume 226. Controller 206 can be utilized to control the temperature provided by heating unit 218. One or both of the first reactant gas R1 or the second reactant gas R2 can be provided from a source 220 thereof via plasma generator 210. As noted hereinabove, utilizing plasma generator 210 to provide one or both of the first reactant gas R1 and/or the second reactant gas R2 can enable surface coating to occur under a wider range of ambient conditions (e.g., temperatures and pressures) inside the enclosed volume 226 as compared to a thermal approach using a heat source such as heating unit 218, and/or enable a wider range of material properties to be realized as compared to a thermal approach using a heat source such as heating unit 218.

In embodiments, the forming of the ALD layer or layers produced as detailed hereinabove is performed prior to and/or subsequent to deposition of a CVD layer. That is, with reference now to FIG. 4, an ALD layer formed by repetition of a combination of one or more steps (i) through (iv) can be the base layer 404 and/or can be another layer 406 deposited subsequent deposition of a disparate base layer (e.g., a layer in direct contact with interior surface 229) or subsequent deposition of an underlying layer or "underlayer" (e.g., a layer deposited prior to the ALD layer, but not in direct contact with interior surface 229). In embodiments, ALD can be utilized to deposit an ALD coating in applications in which no CVD coating is applied. Controller 206 can be utilized to precisely control the pulsing and timing (e.g., sequence and/or residence time of each gas in enclosed volume 226) of gases in each of the one or more steps (i) through (iv).

In embodiments the method can comprise or further comprise forming a CVD layer by: (a) introducing at least a third reactant gas R3 into the enclosed volume 226, such that the at least the third reactant gas R3 chemically reacts with the surface 229. In embodiments, the method comprises both forming an ALD layer and a CVD layer, wherein forming both an ALD layer and a CVD layer comprises forming an ALD layer (e.g., an ALD base layer or underlayer) on the surface 229 and subsequently forming the CVD layer on the ALD layer or forming the CVD layer (e.g., a CVD base layer or underlayer) on the surface 229 and subsequently forming the ALD layer on the CVD layer.

For example and with reference now to FIG. 1A and FIG. 1B, forming a CVD layer can comprise: (a) introducing at least one reactant gas into the enclosed volume 226 such that it chemically reacts with a surface (e.g., interior surface 229) inside the enclosed volume 226. In some examples, forming the CVD layer can comprise introducing two or more reactant gases simultaneously and optionally continuously into the enclosed volume 226 such that the two or more reactant gases chemically react with a surface (e.g., interior surface 229, optionally previously coated with an ALD layer and/or etched via ALE) inside the enclosed volume 226. Controller 206 can be utilized to control the formation of the CVD layer. In embodiments, forming a CVD layer comprises introducing third reactant gas R3 from a gas source 220 and optionally a fourth reactant gas R4 from a gas source 220 into the enclosed volume 226 via delivery line 228. Controller 206 can be utilized to control the timing and duration of introduction of the third and/or fourth (or fifth, and so on) reactant gas into the enclosed volume 226 during formation of the CVD layer. Forming the CVD layer can further comprise (b) removing unreacted third reactant gas R3 and/or fourth reactant gas R4 or so on reactant gases and/or gaseous byproducts from the enclosed volume 226. Steps (a) and (b) of forming a CVD layer can be repeated to obtain a desired number of CVD coatings and a desired thickness of each coating within the CVD layer. Some combination of (a) and/or (b) may be utilized to form the CVD layer. For example, both of (a) and (b) need not be utilized during the forming of the CVD layer (e.g., removing unreacted third reactant gas R3 and/or unreacted fourth reactant gas R4 or so on reactant gases and/or gaseous byproducts from the enclosed volume 226 at (b) may be absent).

During one or more of steps (a) or (b) of forming the CVD layer, heating unit 218 can be operated to provide a desired temperature within enclosed volume 226. Controller 206 can be utilized to control the temperature provided by heating unit 218. One or both of the third reactant gas R3 or the fourth reactant gas R4 (and optionally additional reactant gas(es)) can be provided from a source 220 thereof via plasma generator 210. As noted hereinabove, utilizing plasma generator 210 to provide one or both of the third reactant gas R3 and/or the fourth reactant gas R4 (and optionally additional reactant gas(es)) can enable surface coating to occur under a wider range of ambient conditions (e.g., temperatures and pressures) inside the enclosed volume 226 as compared to a thermal approach using a heat source such as heating unit 218, and/or enable a wider range of material properties to be realized as compared to a thermal approach using a heat source such as heating unit 218.

In embodiments, the CVD layer or layers produced as detailed hereinabove is performed prior to and/or subsequent to deposition of an ALD layer. That is, with reference now to FIG. 4, a CVD layer formed by repetition of a combination of one or more steps (a) through (b) can be the base layer 404 and/or can be another layer 406 deposited subsequent deposition of a disparate base layer (e.g., a layer in direct contact with interior surface 229) or an underlying layer or underlayer (e.g., a layer deposited prior to deposition of this CVD layer, but not in direct contact with interior surface 229). In embodiments, CVD can be utilized to deposit a CVD coating in applications in which no ALD coating is applied. In such cases, gas sources 220 can include third reactant gas R3 and/or fourth reactant gas R4, or so on, but reactant gas R1 and/or reactant gas R2 sources 220 may be absent. (That is, the recitation of a third reactant gas R3 should not be interpreted to require the use of first reactant gas R1 and a second reactant gas R2.) Controller 206 can be utilized to precisely control the pulsing and timing (e.g., the sequence and residence time of each gas in enclosed volume 226) of gases in each of the one or more steps (a) and/or (b).

As noted above, the method of coating the surface 229 of the interior region or volume 224 of the housing, apparatus, or tool 202/well tool 202A can further comprise performing an atomic layer etching (ALE) process to pre-treat the enclosed volume 226 prior to the forming of the one or more coating layers on the all or the portion of the surface 229 of the interior volume 224 of the housing, apparatus, or tool 202/well tool 202A and/or to reduce a thickness of at least one of the one or more coating layers. ALE can comprise (1) applying an etching gas EG to a surface in the enclosed volume 226, such that the surface chemically reacts with and adsorbs the etching gas EG; (2) purging the etching gas EG and any gaseous byproducts from the enclosed volume 226; (3) applying low-energy ions to the portions of the surface that chemically reacted with the etching gas EG to etch away said portions; and (4) optionally purging byproducts from the enclosed volume 226. Applying the etching gas EG to the surface in the enclosed volume 226, can comprise applying the etching gas EG to an uncoated surface 229 to enhance subsequent deposition of a base layer comprising ALD or CVD or to a surface 229 upon which an ALD coating or a CVD coating was last applied (e.g., to an already coated surface 229). Applying the etching gas EG to the surface can comprise actuating the fluid delivery system 208 to supply the etching gas EG from a source 220 thereof to within the enclosed volume 226 via delivery line 228. Subsequent the applying of the EG, performing the ALE can comprise (2) purging the etching gas EG and any gaseous byproducts from the enclosed volume 226, for example by actuating the pump 214 and/or actuating the fluid delivery system 208 to supply a buffer gas (e.g., buffer gas B from a source 220 thereof) to within the enclosed volume 226. Performing the ALE further comprises (3) applying low-energy ions to the portions of the surface that chemically reacted with the etching gas EG in steps (1) and/or (2) to etch away said portions. The low-energy ions can be provided via ion generator 222. Performing the ALE can further comprise optionally purging the enclosed volume 226. The controller 206 be utilized to control the ALE. For example, the controller 206 can implement (2) and/or (4) by actuating the pump 214, actuating the fluid delivery system 208 to supply a buffer gas (e.g., buffer gas B, which can be the same or different in (2) and (4)) to within the enclosed volume 226, or both. The controller 206 can implement (3) by actuating an ion generator 222, which can supply the low-energy ions to the enclosed volume 226. Some or all of these steps can be repeated as many times as is required. Some combination of (1) through (4) may be utilized to perform the ALE. For example, not all of (1) to (4) need be utilized during the ALE (e.g., purging byproducts at (4) may be absent).

For example and with reference now to FIG. 1A and FIG. 1B, the method of coating the surface 229 of the interior region or volume 224 of the housing, apparatus, or tool 202/well tool 202A can comprise: performing an atomic layer etching (ALE) process to pre-treat the enclosed volume 226 prior to the forming of the one or more coating layers on the all or the portion of the surface 229 of the interior volume 224 of the housing, apparatus, or tool 202/well tool 202A and/or to reduce a thickness of at least one of the one or more coating layers. That is, ALE etching can be performed on surface 229 prior to deposition of base layer 404 thereupon, e.g., prior to deposition of a ALD or CVD base layer on uncoated interior surface 229. Alternatively or additionally, performing ALE etching can be effected subsequent to deposition of a CVD layer (e.g., subsequent to deposition of a CVD base layer 404 or an underlying CVD layer 406), subsequent to deposition of an ALD layer (e.g., subsequent to deposition of an ALD base layer 404 or an underlying ALD layer 406), or both subsequent to deposition of a CVD layer and subsequent to deposition of an ALD layer (with the ALD layer being deposited before or after the CVD layer).

As described hereinabove, a method of coating a surface 229 of an interior region or volume 224 of a housing, apparatus, or tool 202/well tool 202A according to this disclosure can further comprise flowing a topical reagent TR to at least one of the one or more coating layers, wherein the topical reagent TR is configured to react with the coating layer and thereby adjust a material characteristic of the coating layer. The flowing of the topical reagent TR to at least one of the one or more coating layers can comprise flowing the topical reagent TR to a topmost coating layer, wherein the topmost coating layer is a one of the one or more coating layers farthest from the uncoated interior surface 229 of the enclosed interior volume 226 of the housing, apparatus, or tool 202/well tool 202A. For example and with reference now to FIG. 1A and FIG. 1B, the flowing the topical reagent TR to at least one of the one or more coating layers can comprise flowing the TR over a deposited ALD layer, flowing the TR over a deposited CVD layer, flowing the TR into the enclosed volume 226 during formation of an ALD layer (e.g., during one or more of the one or more steps (i) through (iv) of forming an ALD layer, as described hereinabove), flowing the TR into the enclosed volume 226 during formation of a CVD layer (e.g., during one or more of the one or both steps (a) or (b) of forming a CVD layer, as described hereinabove), or a combination thereof.

As noted hereinabove, the housing, apparatus, or tool 202 can comprise a furnace tube, an aircraft component (e.g., a wing, a fuselage), a component of a water supply/treatment system; a component of a vehicle fuel system; a well tool 202A; or another housing, apparatus, or tool.

The method can further comprise placing a component within the interior volume 224 (e.g., within enclosed interior volume 226 which serves as a deposition chamber for the component placed therein) of the housing, apparatus, or tool 202/well tool 202A and concurrently coating a surface of the component and a surface 229 adjacent the interior volume 224 of the housing, apparatus, or tool 202/well tool 202A.

Forming the one or more coating layers on all or a portion of the surface 229 of the enclosed interior volume 226 of the housing, apparatus, or tool 202/well tool 202A via reaction of the reactant gases, optionally in the presence of the plasma, can further comprise actuating the housing, apparatus, or tool 202/well tool 202A to expose an additional surface (e.g., one or more surfaces of a telescoping component of the tool 202/well tool 202A) in the enclosed interior volume 226 of the housing, apparatus, or tool 202/well tool 202A and coating at least a portion of the additional surface.

The forming of the one or more coating layers can be effected at a worksite (e.g., wellsite 100) at which the housing, apparatus, or tool 202/well tool 202A will subsequently be employed (e.g., well tool 202A placed downhole for use), has previously been employed (e.g., well tool 202A recovered from downhole use), or both. For example, one or more coating layers can be formed on a well tool 202A at a wellsite 100 at which the well tool 202A has been and/or will be employed.

The housing, apparatus, or tool 202 can comprise a well tool 202A. The well tool 202A can comprise a logging while drilling (LWD) tool, a measurements while drilling (MWD) tool, or a sampling while drilling (SWD) tool. In such embodiments, the interior volume 224 of the well tool 202A can comprise a fluid flow path configured for flow of a formation fluid from an exterior E of the well tool 202A through an interior (e.g., interior volume 224) of the well tool 202A. In some embodiments, the interior volume 224 of the well tool 202A can comprise a fluid flow path configured for flow of a formation fluid from an exterior E of the well tool 202A through an inlet(s) (205A/B) and an interior (e.g., interior volume 224) of the well tool 202A and back out of the well tool 202A via discard line outlet 207A. In some embodiments, the interior volume 224 of the well tool 202A can comprise a fluid flow path configured for flow of a formation fluid from an exterior E of the well tool 202A through an inlet (sample line inlet 205B) and interior (e.g., interior volume 224) of the well tool 202A and into a sample chamber 90.

The method can further comprise, subsequent the coating, placing the housing, apparatus, or tool 202/well tool 202A in an operating environment therefor (e.g., a wellbore 102) and contacting the coated surface 229 with an operations fluid (e.g., contacting the coated surface 229 with formation fluid from the formation 104). For example and with reference now to FIG. 6, due to the portability of the herein disclosed coating system 200/well tool coating system 200A, a coating can be formed on all or a portion of the interior surface 229 of the enclosed volume 226 of the well tool 202A, and the well tool 202A subsequently introduced into a wellbore 102 for utilization thereof (e.g., for taking one or more formation fluid samples). Prior to coating the tool 202A, analysis of the formation fluid and/or an anticipated composition thereof can be utilized to determine what coating to deposit on one or more surfaces of an interior volume 224 of the well tool 202A. Subsequent utilization downhole in wellbore 102 (for example subsequent the taking of formation samples in sample chambers 90 as described hereinabove with reference to the well tool 202A of FIG. 6), formation sample analysis can again be utilized to determine whether or not the well tool 202A should be subjected to further coatings with well tool coating system 200A. For example, in applications where anticipated formation composition is utilized to determine an initial coating of the enclosed volume(s) 226 of well tool 202A, following utilization of well tool 202A downhole to obtain the one or more formation fluid samples in the one or more sample chambers 90, analysis of the formation samples retrieved from downhole by the well tool 202A can be utilized to determine if alternative and/or additional coating layers should be deposited within well tool 202A. For example, should anticipated formation composition not include significant mercury (Hg) and/or hydrogen sulfide ($H_2S$), and no initial coating be performed within well tool 202A, while analysis of sample(s) retrieved from the formation 104 indicates the presence of substantial $H_2S$ and/or Hg (or another component which can interfere with formation fluid analysis and/or corrode well tool 202A), a coating process of the type disclosed herein can be performed on-site to reduce the interaction of the interior surface 229 with the formation fluid during subsequent testing with well tool 202A. Alternatively, if an initial coating selected for the well tool 202A were to prove ineffective to prevent and/or reduce interaction of the analyzed formation fluid obtained with well tool 202A, a new or additional coating of well tool 202A can be performed based on the analysis of the obtained formation fluid in sample chamber(s) 90 prior to further sampling therewith. If desired, etching to remove all or a portion of prior deposited coating(s) can be effected via ALE, as detailed hereinabove, prior to deposition of the new or additional coating layer(s).

Those of ordinary skill in the art will readily appreciate various benefits that may be realized by the present disclosure. The herein disclosed coating system 200/well tool coating system 200A enable on-site coating of interior surfaces 229 of a housing, apparatus, or tool 202/well tool 202A at a jobsite, for example, at a wellsite 100 where a downhole tool 202A will be and/or has previously been utilized. This allows for the deposition of coatings within tools upon determination of a composition of a fluid to which the interior of the housing, apparatus, or tool 202/well tool 202A will subsequently be employed. The coatings can thus be tailored to meet the needs of a particular application at hand and thereby avoid costly delays associated with transporting a housing, apparatus, or tool 202/well tool 202A to a traditional coating facility at a fixed location that may be hundreds of miles from the worksite.

In accordance with the present disclosure, it may be desirable to deposit a coating on a surface (e.g., within a well tool) to withstand a particular environment to which the surface will be exposed during operation, and thereby prolong a life of a housing, apparatus or tool comprising the surface. In contrast to traditional deposition systems that require a well tool to be disassembled into subcomponents of small enough size to fit inside an expensive commercial vacuum-chamber, which serves as a deposition chamber, housings, apparatus, and tools (e.g., well tools) need not be disassembled prior to coating with the methods, systems, and devices disclosed herein. Furthermore, in contrast to transporting a housing, apparatus, or tool to a commercial vacuum-chambers located at manufacturing facilities or laboratory facilities (which restricts when and how many times a surface coating process can be applied to the well tool), in accordance with the present disclosure housing, apparatus, and tools (e.g., well tools) can be coated proximate a jobsite (e.g., wellsite) and need not be transported, thereby saving the cost and time associated with transportation and promotes the application of multiple coatings (e.g., between jobs) as needed.

In some aspects, coatings can be deposited on and within well tools according to one or more of the following examples.

Example #1: A system of the present disclosure can include at least two closures for enclosing a well tool to form a deposition chamber in an interior of the well tool. The system can include a first reactant-gas source coupled to fluid delivery system and a second reactant-gas source coupled to the fluid delivery system for supplying a first reactant gas and a second reactant gas, respectively, to the deposition chamber during an atomic layer deposition (ALD) process. The system can include a third reactant-gas source coupled to the fluid delivery system for supplying a third reactant gas to the deposition chamber during a chemical vapor deposition (CVD) process. The system can include a controller coupled to the fluid delivery system for switching the system between applying the ALD process and/or the CVD process to the deposition chamber within the well tool.

Example #2: The system of Example #1 may feature the controller being operable to cause the CVD process to be performed within the well tool prior to the ALD process for forming a base layer of material on an interior surface of the well tool. The base layer of material can be configured to bond with a coating from the ALD process.

Example #3: The system of any of Examples #1-2 may feature the controller being operable to cause the ALD process to be performed within the well tool prior to the CVD process for forming a base layer of material on an interior surface of the well tool. The base layer of material can be configured to bond with a coating from the CVD process.

Example #4: The system of any of Examples #1-3 may feature the fluid delivery system being configured to control flow of at least one solvent and/or at least one oxidizer through the interior of the well tool for preparing the interior of the well tool for the ALD process or the CVD process.

The controller can be configured to operate the fluid delivery system prior to the ALD process and/or the CVD process for flushing the interior of the well tool with the at least one solvent and the at least one oxidizer.

Example #5: The system of any of Examples #1-4 may feature a cover for a part of the well tool. The cover can be configured to prevent the ALD process and/or the CVD process from being applied to the part.

Example #6: The system of any of Examples #1-5 may feature the fluid delivery system being configured to control flow of a topical reagent to a coating layer deposited during the ALD process or the CVD process. The topical reagent can be configured to react with the coating layer and thereby adjust a material characteristic of the coating layer.

Example #7: The system of any of Examples #1-6 may feature a plasma generator configured to convert a reactant gas into a plasma for performing the ALD process or the CVD process.

Example #8: The system of any of Examples #1-7 may feature the well tool being positioned at a wellsite, and the system being configured for performing the ALD process and/or the CVD process at the wellsite.

Example #9: Another system of the present disclosure can include a fluid delivery system for supplying a plurality of reactant gases to a deposition chamber formed within an interior of a well tool during an atomic layer deposition (ALD) process and a chemical vapor deposition (CVD) process. The system can include a plasma generator for converting at least one reactant gas among the plurality of reactant gases into a plasma for performing the ALD process or the CVD process. The system can include a controller coupled to the fluid delivery system. The controller can be for switching the fluid delivery system between applying the ALD process and/or the CVD process to the deposition chamber within the well tool.

Example #10: The system of Example #9 may feature the controller being configured to operate a first set of valves in the fluid delivery system sequentially for performing the ALD process. The controller can be configured to operate a second set of valves in the fluid delivery system simultaneously for performing the CVD process.

Example #11: The system of Example #10 may feature the controller being configured to operate the fluid delivery system such that the CVD process is performed prior to the ALD process.

Example #12: The system of any of Examples #10-11 may feature the fluid delivery system being configured to control flow of at least one solvent and/or at least one oxidizer through the interior of the well tool for preparing the interior of the well tool for the ALD process or the CVD process. The controller can be configured to operate the fluid delivery system prior to the ALD process and/or the CVD process for flushing the interior of the well tool with the at least one solvent and the at least one oxidizer.

Example #13: The system of any of Examples #10-12 may feature the fluid delivery system being configured to control flow of a topical reagent to an uppermost coating layer resulting from the ALD process or the CVD process. The topical reagent can be configured to react with the uppermost coating layer and thereby adjust a material characteristic of the uppermost coating layer.

Example #14: The system of any of Examples #10-13 may feature the well tool being positioned at a wellsite. The system can be a mobile unit configured for performing the ALD process and/or the CVD process at the wellsite.

Example #15: A method of the present disclosure can include creating one or more deposition chambers inside the one or more well tools. The method can include depositing coatings inside the one or more deposition chambers by applying an atomic layer deposition (ALD) process and a chemical vapor deposition (CVD) process to the one or more well tools.

Example #16: The method of Example #15 may further include depositing a base layer of material on an interior surface of a well tool among the one or more well tools by applying the CVD process. The method can include, subsequent to depositing the base layer of material, depositing a coating onto the base layer using the ALD process such that the coating bonds with the base layer of material.

Example #17: The method of any of Examples #15-16 may further include depositing a base layer of material on an interior surface of a well tool among the one or more well tools by applying the ALD process. The method can include, subsequent to depositing the base layer of material, depositing a coating onto the base layer using the CVD process such that the coating bonds with the base layer of material.

Example #18: The method of any of Examples #15-17 may further include flushing an interior of a well tool among the one or more well tools with at least one solvent and/or at least one oxidizer to prepare the interior of the well tool for the ALD process or the CVD process.

Example #19: The method of any of Examples #15-18 may further include applying the ALD process or the CVD process by: converting a reactant gas into a plasma using a plasma generator, and depositing the plasma within a well tool among the one or more well tools.

Example #20: The method of any of Examples #15-19 may further include preventing the ALD process or the CVD process from being performed on a part of a well tool among the one or more well tools by covering the part.

Example #21: The method of any of Examples #15-20 may further include coating multiple surfaces of a movable part inside a well tool among the one or more well tools by actuating the movable part between at least two positions during the ALD process or the CVD process.

Example #22: The method of any of Examples #15-21 may further include adjusting a material characteristic of a coating layer deposited during the ALD process or the CVD process by applying a topical reagent to the coating layer.

Example #23: The method of any of Examples #15-22 may further include positioning the one or more well tools in one or more wellbores subsequent to performing the ALD process and/or the CVD process.

Example #24: The method of any of Examples #15-22 may further include depositing the coatings inside the one or more well tools while the one or more well tools and the material deposition system are positioned at a wellsite.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure. For instance, any example(s) described herein can be combined with any other example(s) to yield further examples.

Additional Disclosure Part I

The following are non-limiting, specific embodiments in accordance with the present disclosure:

Embodiment A: A well tool coating system comprising: a well tool having an interior surface to be coated; a closure for releasably enclosing a volume within the well tool containing the interior surface; a plurality of reactant gas sources including reactant gases for one or more surface coating process; a gas supply system selectively coupling the plurality of reactant gas sources with the enclosed volume of the well tool; and a controller in communication with the gas supply system to supply a sequence of the reactant gases to the enclosed volume of the well tool.

Embodiment B: The well tool coating system of Embodiment A, wherein the plurality of reactant gases comprise one or both of a first reactant gas for an atomic layer deposition (ALD) process and a second reactant gas for a chemical vapor deposition (CVD) process.

Embodiment C: The well tool coating system of Embodiment A or Embodiment B, wherein the well tool comprises one or more movable parts internal to the enclosed volume that are moved as reactant gases are supplied to the enclosed volume of the well tool.

Embodiment D: The well tool coating system of any of Embodiment A to Embodiment C, wherein the closure comprises: a first closure element for releasably closing an upstream end of the enclosed volume; and a second closure element for releasably closing a downstream end of the enclosed volume.

Embodiment E: The well tool coating system of any of Embodiment A to Embodiment D, wherein the closure comprises one or more closure ports each fluidly coupling at least one of the reactant gas sources to the enclosed volume of the well tool.

Embodiment F: The well tool coating system of any of Embodiment A to Embodiment E, wherein the controller comprises control logic for automating a sequence including steps of delivering a first reactant gas to the enclosed volume of the well tool, purging the first reactant gas, and delivering a second reactant gas to the enclosed volume of the well tool.

Embodiment G: The well tool coating system of any of Embodiment A to Embodiment F, further comprising: a heating unit in thermal communication with the well tool and in electronic communication with the controller to control heating of the well tool while controlling delivery of reactant gas to the well tool.

Embodiment H: The well tool coating system of any of Embodiment A to Embodiment G, further comprising: a pump fluidly coupled to the enclosed volume of the well tool for selectively purging gas from the enclosed volume.

Embodiment I: The well tool coating system of any of Embodiment A to Embodiment H, wherein the well tool is positioned downhole at a wellsite.

Embodiment J: The well tool coating system of any of Embodiment A to Embodiment I, wherein the controller is operable to cause a CVD process to be performed within the well tool prior to an ALD process for forming a base layer of material on an inner surface of the well tool, the base layer of material being configured to bond with a coating from the ALD process.

Embodiment K: A method, comprising: enclosing a volume within a well tool containing an interior surface to be coated; and delivering a sequence of reactant gases to the enclosed volume of the well tool, including one or both of a first reactant gas for an atomic layer deposition (ALD) process and a second reactant gas for a chemical vapor deposition (CVD) process.

Embodiment L: The method of Embodiment K, further comprising: moving a movable part of the well tool internal to the enclosed volume while delivering at least a portion of the sequence of reactant gases to the enclosed volume.

Embodiment M: The method of Embodiment K or Embodiment L, further comprising flowing at least one solvent and/or at least one oxidizer into the enclosed volume prior to delivering the sequence of reactant gases to the enclosed volume of the well tool.

Embodiment N: The method of any of Embodiment K to Embodiment M, further comprising flowing a topical reagent to a coating layer within the enclosed volume after performing the ALD process or the CVD process, thereby reacting the topical reagent with the coating layer and thereby adjusting a material characteristic of the coating layer.

Embodiment O: A method comprising: enclosing one or more volumes inside one or more well tools; and delivering reactant gases to the one or more enclosed volumes of the one or more well tools during an atomic layer deposition (ALD) process and a chemical vapor deposition (CVD) process to deposit coatings inside the one or more enclosed volumes.

Embodiment P: The method of Embodiment O, further comprising: depositing a base layer of material on an interior surface of a well tool among the one or more well tools by applying the CVD process; and, subsequent to depositing the base layer of material, depositing a coating onto the base layer of material using the ALD process such that the coating bonds with the base layer of material.

Embodiment Q: The method of Embodiment O, further comprising: depositing a base layer of material on an interior surface of a well tool among the one or more well tools by applying the ALD process; and subsequent to depositing the base layer of material, depositing a coating onto the base layer of material using the CVD process such that the coating bonds with the base layer of material.

Embodiment R: The method of any of Embodiment O to Embodiment Q, further comprising flowing at least one solvent and/or at least one oxidizer to an enclosed volume of a well tool among the one or more well tools to prepare enclosed volume of the well tool for the ALD process or the CVD process.

Embodiment S: The method of any of Embodiment O to Embodiment R, further comprising: converting at least one of the reactant gases into a plasma using a plasma generator; and communicating the plasma to an enclosed volume among the one or more enclosed volumes.

Embodiment T: The method of any of Embodiment O to Embodiment S, further comprising preventing the ALD process or the CVD process from being performed on a part of a well tool among the one or more well tools by covering the part.

Embodiment U: The method of any of Embodiment O to Embodiment T, further comprising coating multiple surfaces of a movable component inside an enclosed volume among the one or more enclosed volumes by actuating the movable component between at least two positions during the ALD process or the CVD process.

Embodiment V: The method of any of Embodiment O to Embodiment U, further comprising flowing a topical reagent to a coating layer while performing one or both of the ALD process and/or the CVD process, thereby reacting the topical reagent with the coating layer and thereby adjusting a material characteristic of the coating layer.

Embodiment W: The method of any of Embodiment O to Embodiment V, further comprising positioning the one or more well tools in one or more wellbores subsequent to performing the ALD process and/or the CVD process.

Embodiment X: The method of any of Embodiment O to Embodiment W, further comprising depositing the coatings inside the one or more well tools while the one or more well tools are positioned at a wellsite.

Embodiment Y: A coating device for coating an interior surface adjacent an interior volume disposed within a housing, the interior volume having an inlet and an outlet and extending through the housing such that the interior volume is accessible from an exterior of the housing via the inlet and the outlet, the device comprising: a first closure fluidically coupled to a delivery line and configured to sealingly engage with the inlet to the interior volume of the housing; a second closure fluidically coupled to a vacuum line and configured to sealingly engage with the outlet from the interior volume of the housing; a plurality of reactant gas sources comprising reactant gases for one or more surface coating processes fluidically coupled to the delivery line; optionally, a plasma generator configured to generate a plasma and fluidically coupled to the delivery line; and a pump fluidically coupled to the vacuum line and configured to create a vacuum in the interior volume, said vacuum effective to draw one or more reactant gases from the plurality of reactant gas sources and optionally plasma from the plasma generator into the interior volume of the housing via the delivery line and inlet such that upon reaction of the one or more reactant gases, optionally in the presence of the plasma, a coating is formed on all or a portion of the interior surface adjacent the interior volume of the housing.

Embodiment Z1: The coating device of Embodiment Y further comprising an ion generator configured for applying an atomic layer etching (ALE) process to the surface.

Embodiment Z2: The coating device of Embodiment Y or Embodiment Z further comprising a heating unit in thermal communication with the housing.

Embodiment Z3: The coating device of any of Embodiment A to Embodiment Z2 further comprising a controller in communication with the heater and the plurality of reactant gas sources, the controller operable to control heating of the housing, control delivery of reactant gas to the interior volume, or both.

Embodiment Z4: The coating device of any of Embodiment Y to Embodiment Z3 further comprising a trap upstream of the pump and downstream of the housing, the trap operable as a filter and/or a second or auxiliary coating chamber.

Embodiment Z5: The coating device of any of Embodiment Y to Embodiment Z4, wherein the one or more surface coating processes comprise chemical vapor deposition (CVD), atomic layer deposition (ALD), or both.

Embodiment Z6: The coating device of any of Embodiment Y to Embodiment Z5, wherein the housing comprises a furnace tube, an aircraft component, a component of a water supply/treatment system; a component of a vehicle fuel system; or another housing.

Embodiment Z7: The coating device of any of Embodiment Y to Embodiment Z6, wherein the interior volume has an aspect ratio that is less than or equal to about 0.5, 0.05, or 0.005, wherein the aspect ratio is an average width of the interior volume divided by an average length thereof.

Embodiment Z8: The coating device of any of Embodiment Y to Embodiment Z7, wherein the coating device is portable, and further comprises a portable conveyance configured to transport the coating device to a worksite proximate the housing.

Embodiment Z9: A method of coating an interior surface adjacent an interior volume of a housing, the interior volume having an inlet and an outlet, the method comprising: positioning the coating device of any of Embodiment Y to Embodiment Z8 and the housing proximate each other; sealingly engaging the first closure to the inlet of the interior volume of the housing, and sealingly engaging the second closure to the outlet of the interior volume of the housing to form an enclosed volume; activating the pump to create the vacuum in the interior volume of the housing; drawing by the vacuum one or more of the reactant gases from the plurality of reactant gas sources, plasma from the plasma generator, or both into the interior volume of the housing via the delivery line and inlet; and forming one or more coating layers on all or a portion of the interior surface adjacent the interior volume of the housing via reaction of the one or more reactant gases, optionally in the presence of the plasma.

Embodiment Z10: A method of coating an interior surface adjacent an interior volume of a housing, the interior volume having an inlet and an outlet, the method comprising: enclosing all or a portion of the interior volume of the housing to yield an enclosed volume; introducing one or more reactant gases, plasma, or both to the enclosed volume; and forming one or more coating layers on all or a portion of the interior surface adjacent the enclosed interior volume of the housing via reaction of the reactant gases, optionally in the presence of the plasma.

Embodiment Z11: The method of Embodiment Z9 or Embodiment Z10, wherein the reaction comprises a chemical vapor deposition (CVD) reaction, an atomic layer deposition (ALD) reaction, or both, such that the one or more coating layers respectively comprise an ALD layer, a CVD layer, or both.

Embodiment Z12: The method of Embodiment Z11 further comprising: (i) forming the ALD layer by: introducing a first reactant gas into the enclosed volume, such that at least a portion of the first reactant gas chemically bonds with the surface to form a reactive layer; removing unreacted first reactant gas and/or gaseous byproducts from the enclosed volume; introducing a second reactant gas into the enclosed volume, such that at least some of the second reactant gas bonds with the reactive layer to form the ALD layer; and optionally removing unreacted second reactant gas and/or gaseous byproducts from the enclosed volume; (ii) forming the CVD layer by: introducing at least a third reactant gas and optionally a fourth reactant gas into the enclosed volume, such that the at least the third reactant gas chemically reacts with the surface; and optionally removing unreacted third reactant gas R3 and/or optional fourth reactant gas R4 and/or gaseous byproducts from the enclosed volume; or (iii) both forming an ALD layer as set forth in (i) and a CVD layer as set forth in (ii), forming both an ALD layer and a CVD layer including forming an ALD layer on the surface and subsequently forming the CVD layer on the ALD layer or forming the CVD layer on the surface and subsequently forming the ALD layer on the CVD layer.

Embodiment Z13: The method of Embodiment Z12 further comprising performing an atomic layer etching (ALE) process to pre-treat the surface prior to the forming of the one or more coating layers on the all or the portion of the interior surface adjacent the interior volume of the housing and/or to reduce a thickness of at least one of the one or more coating layers.

Embodiment Z14: The method of Embodiment Z13, wherein ALE comprises: applying an etching gas to a surface in the enclosed volume, such that the surface chemically reacts with and adsorbs the etching gas; purging the etching gas and any gaseous byproducts from the enclosed volume; applying low-energy ions to the portions of the surface that chemically reacted with the etching gas to etch away said portions; and optionally purging byproducts from the enclosed volume.

Embodiment Z15: The method of any of Embodiment Z12 to Embodiment Z14 further comprising flowing a topical reagent to at least one coating layer of the one or more coating layers, the topical reagent configured to react with the at least one coating layer and thereby adjust a material characteristic of the at least one coating layer.

Embodiment Z16: The method of Embodiment Z15, wherein the flowing of the topical reagent to at least one of the one or more coating layers comprises flowing the topical reagent to a topmost coating layer, the topmost coating layer being one of the one or more coating layers positioned farthest away from the interior surface adjacent the interior volume of the housing.

Embodiment Z17: The method of any of Embodiment Z9 to Embodiment Z16, wherein the housing comprises a furnace tube, an aircraft component, a component of a water supply/treatment system; a component of a vehicle fuel system; a well tool; or another housing.

Embodiment Z18: The method of any of Embodiment Z9 to Embodiment Z17 further comprising placing a component within the interior volume of the housing and concurrently coating a surface of the component and the interior surface adjacent the interior volume of the housing.

Embodiment Z19: The method of any of Embodiment Z9 to Embodiment Z19, wherein the enclosed volume comprises a fluid flow path within the housing.

Embodiment Z20: The method of any of Embodiment Z9 to Embodiment Z19 further comprising forming the one or more coating layers at a worksite at which the housing will subsequently be employed post-coating or has been employed pre-coating.

Embodiment Z21: The method of any of Embodiment Z9 to Embodiment Z20, wherein the housing comprises a well tool, the well tool a logging while drilling (LWD) tool, a measurements while drilling (MWD) tool, or a sampling while drilling (SWD) tool, and the interior volume of the well tool including a fluid flow path configured for flow of a formation fluid from an exterior of the well tool through an interior of the well tool.

Embodiment Z22: The method of Embodiment Z21, wherein forming the one or more coating layers on all or the portion of the interior surface adjacent the enclosed interior volume of the housing via reaction of the reactant gases, optionally in the presence of the plasma, further comprises actuating the well tool to expose an additional surface in the interior volume of the well tool and coating at least a portion of the additional surface.

Embodiment Z23: The method of Embodiment Z21 further comprising placing the well tool in a wellbore and contacting the formation fluid with the coated surface.

Embodiment Z24: The method of Embodiment Z23, wherein contacting the formation fluid with the coated surface further comprises taking a formation fluid sample with the well tool.

Embodiment Z25: The method of Embodiment Z24 further comprising retrieving the formation fluid sample from the wellbore, performing a composition analysis of the formation fluid sample, and determining whether or not to recoat all or a portion of the interior volume of the well tool based on the compositional analysis.

Embodiment Z26: The method of Embodiment Z25 further comprising responsive to an affirmative decision to recoat, recoating all or a portion of the interior volume of the well tool using the method of any of Embodiment Z9 to Embodiment Z16 and/or the coating device of any of Embodiment Y to Embodiment Z8.

Additional Disclosure Part II

The following are non-limiting, specific embodiments in accordance with the present disclosure:

A first embodiment, which is a device for coating an interior surface of a housing defining a volume, comprising a plurality of reactant gas sources including reactant gases for one or more surface coating processes, first and second closures to sealingly engage with an inlet and outlet of the volume of the housing to provide an enclosed volume, a delivery line fluidically coupled to the first closure and the plurality of reactant gas sources to deliver the reactant gases to the enclosed volume, and an output line fluidically coupled to the second closure to remove one or more reactant gases, byproduct gases, or both from the enclosed volume.

A second embodiment, which is the device of the first embodiment further comprising a plasma source fluidically coupled to the delivery line to provide plasma for the one or more surface coating processes, an ion source fluidically coupled to the delivery line to provide ions for the one or more surface coating processes, a pump fluidically coupled to the output line to remove one or more reactant gases, byproduct gases, or both from the enclosed volume, a heating unit in thermal communication with the housing to heat the housing for the one or more surface coating processes, a controller in electronic communication with the plurality of reactant gas sources, the plasma source, the ion source, the pump, and/or the heating unit to control the plurality of reactant gas sources, the plasma source, the ion source, the pump, and/or the heating unit during the one or more surface coating processes, or any combination thereof.

A third embodiment, which is the device of the second embodiment further comprising a trap upstream of the pump and downstream of the housing.

A fourth embodiment, which is the device of any of the first through the third embodiments, wherein the one or more surface coating processes comprise chemical vapor deposition (CVD), atomic layer deposition (ALD), or both.

A fifth embodiment, which is the device of any of the first through the fourth embodiments, wherein the volume has an aspect ratio that is less than or equal to about 0.5, the aspect ratio being an average width of the volume divided by an average length thereof.

A sixth embodiment, which is the device of any of the first through the fifth embodiments, wherein the housing comprises a furnace tube, an aircraft component, a component of a water supply/treatment system; or a component of a vehicle fuel system.

A seventh embodiment, which is the device of any of the first through the sixth embodiments, wherein the coating device is portable and further comprises a hauler to transport the coating device to a worksite proximate the housing.

An eighth embodiment, which is a method of coating an interior surface of a housing defining a volume, the method comprising positioning the coating device of claim 1 and the housing proximate each other, sealingly engaging the first closure to an inlet of the housing and sealingly engaging the second closure to an outlet of the housing to form an enclosed volume, introducing one or more reactant gases, a plasma, or a combination thereof to the enclosed volume via the delivery line, and forming one or more coating layers on all or a portion of the interior surface within the enclosed volume by reaction of the one or more reactant gases, the plasma, or the combination thereof.

A ninth embodiment, which is the method of the eighth embodiment, wherein the reaction comprises a chemical vapor deposition (CVD) reaction, an atomic layer deposition (ALD) reaction, or both, such that the one or more coating layers respectively comprise an ALD layer, a CVD layer, or both.

A tenth embodiment, which is the method of the ninth embodiment further comprising (i) forming the ALD layer by introducing a first reactant gas into the enclosed volume, such that at least a portion of the first reactant gas chemically bonds with the interior surface to form a reactive layer; removing unreacted first reactant gas and/or gaseous byproducts from the enclosed volume; introducing a second reactant gas into the enclosed volume, such that at least some of the second reactant gas bonds with the reactive layer to form the ALD layer, (ii) forming the CVD layer by introducing at least a third reactant gas into the enclosed volume such that the at least the third reactant gas chemically reacts with the interior surface to form the CVD layer, or (iii) both forming an ALD layer via (i) and a CVD layer via (ii), wherein forming both an ALD layer and a CVD layer comprises forming an ALD layer on the interior surface and subsequently forming the CVD layer on the ALD layer or forming the CVD layer on the interior surface and subsequently forming the ALD layer on the CVD layer.

An eleventh embodiment, which is the method of the tenth embodiment further comprising performing an atomic layer etching (ALE) process to pre-treat the interior surface prior to the forming of the one or more coating layers and/or to reduce a thickness of at least one of the one or more coating layers.

A twelfth embodiment, which is the method of the eleventh embodiment, wherein ALE comprises introducing an etching gas to the enclosed volume such that the interior surface chemically reacts with and adsorbs the etching gas; purging the etching gas and any gaseous byproducts from the enclosed volume; and applying low-energy ions to the portions of the surface that chemically reacted with the etching gas to etch away said portions.

A thirteenth embodiment, which is the method of the tenth embodiment further comprising introducing a topical reagent to at least one of the one or more coating layers, wherein the topical reagent reacts with the coating layer to adjust a material characteristic of the coating layer.

A fourteenth embodiment, which is the method of the thirteenth embodiment, wherein the introducing the topical reagent to at least one of the one or more coating layers comprises introducing the topical reagent to a topmost coating layer, the topmost coating layer being one of the one or more coating layers positioned farthest away from the interior surface.

A fifteenth embodiment, which is the method of any of the eighth through the fourteenth embodiments, wherein the housing comprises a furnace tube, an aircraft component, or a component of a water supply/treatment system; or a component of a vehicle fuel system.

A sixteen embodiment, which is the method of any of the eighth through the fifteenth embodiments, wherein the housing comprises a well tool, wherein the well tool is a logging while drilling (LWD) tool, a measurements while drilling (MWD) tool, or a sampling while drilling (SWD) tool, and wherein the volume of the well tool defines a fluid flow path for flow of a formation fluid from an exterior of the well tool through an interior of the well tool.

A seventeenth embodiment, which is the method of the sixteenth embodiment, wherein forming the one or more coating layers on all or the portion of the interior surface further comprises actuating the well tool to expose an additional interior surface of the well tool and coating at least a portion of the additional interior surface.

An eighteenth embodiment, which is the method of the sixteenth embodiment further comprising placing the well tool in a wellbore and contacting the formation fluid with the coated surface.

A nineteenth embodiment, which is the method of the eighteenth embodiment, wherein the well tool is a formation sampling tool, and further comprising taking a formation fluid sample with the well tool, retrieving the formation fluid sample from the wellbore, performing a composition analysis of the formation fluid sample, and determining whether or not to recoat all or a portion of the interior surface of the well tool based on the compositional analysis.

A twentieth embodiment, which is a method of coating an interior surface of a housing defining a volume, the method comprising enclosing all or a portion of the volume of the housing to yield an enclosed volume, introducing one or more reactant gases, plasma, or a combination thereof to the enclosed volume, and forming one or more coating layers on all or a portion of an interior surface adjacent the enclosed volume via reaction of the reactant gases, the plasma, or the combination thereof.

A twenty-first embodiment, which is a system comprising the device of any of the first to seventh embodiments and a housing (e.g., well tool) defining a volume, wherein the device is coupled to the housing to perform the one or more surface coating processes.

A twenty-second embodiment, which is the method of any of the eighth to twentieth embodiments carried out with the system of the twenty-first embodiment.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: $R=Rl+k*(Ru-Rl)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. A method of coating an interior surface adjacent an interior volume of a housing, the interior volume having an inlet and an outlet, the method comprising: enclosing all or a portion of the interior volume of the housing to yield an enclosed volume by sealingly engaging a first closure to the inlet of the housing and sealingly engaging a second closure to the outlet of the housing to form the enclosed volume; introducing one or more reactant gases, plasma, or both to the enclosed volume via a delivery line directly coupled to the first closure; and forming one or more coating layers on all or a portion of the interior surface adjacent the enclosed interior volume of the housing via reaction of the reactant gases, optionally in the presence of the plasma, wherein the reaction comprises a chemical vapor deposition (CVD) reaction, an atomic layer deposition (ALD) reaction, or both, such that the one or more coating layers respectively comprise an ALD layer, a CVD layer, or both, and wherein the housing comprises a formation fluid sampling tool.

2. The method of claim 1, further comprising: (i) forming the ALD layer by: introducing a first reactant gas into the enclosed volume, such that at least a portion of the first reactant gas chemically bonds with the surface to form a reactive layer; removing unreacted first reactant gas and/or gaseous byproducts from the enclosed volume; introducing a second reactant gas into the enclosed volume, such that at least some of the second reactant gas bonds with the reactive layer to form the ALD layer; and optionally removing unreacted second reactant gas and/or gaseous byproducts from the enclosed volume; (ii) forming the CVD layer by: introducing at least a third reactant gas and optionally a fourth reactant gas into the enclosed volume, such that the at least the third reactant gas chemically reacts with the surface; and optionally removing unreacted third reactant gas and/or optional fourth reactant gas and/or gaseous byproducts from the enclosed volume; or (iii) both forming an ALD layer as set forth in (i) and a CVD layer as set forth in (ii), forming both an ALD layer and a CVD layer including forming an ALD layer on the surface and subsequently forming the CVD layer on the ALD layer or forming the CVD layer on the surface and subsequently forming the ALD layer on the CVD layer.

3. The method of claim 2, further comprising performing an atomic layer etching (ALE) process to pre-treat the surface prior to the forming of the one or more coating layers on the all or the portion of the interior surface adjacent the interior volume of the housing and/or to reduce a thickness of at least one of the one or more coating layers.

4. The method of claim 3, wherein ALE comprises: applying an etching gas to a surface in the enclosed volume, such that the surface chemically reacts with and adsorbs the etching gas; purging the etching gas and any gaseous byproducts from the enclosed volume; applying low-energy ions to the portions of the surface that chemically reacted with the etching gas to etch away said portions; and optionally purging byproducts from the enclosed volume.

5. The method of claim 2, further comprising flowing a topical reagent to at least one coating layer of the one or more coating layers, the topical reagent configured to react with the at least one coating layer and thereby adjust a material characteristic of the at least one coating layer.

6. The method of claim 5, wherein the flowing of the topical reagent to at least one of the one or more coating layers comprises flowing the topical reagent to a topmost coating layer, the topmost coating layer being one of the one or more coating layers positioned farthest away from the interior surface adjacent the interior volume of the housing.

7. The method of claim 1, further comprising placing a component within the interior volume of the housing and concurrently coating a surface of the component and the interior surface adjacent the interior volume of the housing.

8. The method of claim 1, wherein the enclosed volume comprises a fluid flow path within the housing.

9. The method of claim 1, further comprising forming the one or more coating layers at a worksite at which the housing will subsequently be employed post-coating or has been employed pre-coating.

10. The method of claim 1, wherein the well tool is a sampling while drilling (SWD) tool, and the interior volume of the well tool including a fluid flow path configured for flow of a formation fluid from an exterior of the well tool through an interior of the well tool.

11. The method of claim 10, wherein forming the one or more coating layers on all or the portion of the interior surface adjacent the enclosed interior volume of the housing via reaction of the reactant gases, optionally in the presence of the plasma, further comprises actuating the well tool to expose an additional surface in the interior volume of the well tool and coating at least a portion of the additional surface.

12. The method of claim 10, further comprising placing the well tool in a wellbore and contacting the formation fluid with the coated surface.

13. The method of claim 12, wherein contacting the formation fluid with the coated surface further comprises taking a formation fluid sample with the well tool.

14. The method of claim 13, further comprising retrieving the formation fluid sample from the wellbore, performing a composition analysis of the formation fluid sample, and recoating or not recoating all or a portion of the interior volume of the well tool based on the compositional analysis.

15. The method of claim 14, comprising recoating all or the portion of the interior volume of the well tool based on the compositional analysis.

16. The method of claim 15 further comprising performing atomic layer etching prior to the recoating of the all or the portion of the interior volume of the well tool.

17. A method of coating an interior surface of a housing defining a volume, the method comprising:

positioning a coating device and the housing proximate each other, wherein the housing comprises a formation fluid sampling tool, wherein the coating device comprises a plurality of reactant gas sources including reactant gases for one or more surface coating processes, first and second closures to sealingly engage with an inlet and outlet of the volume of the housing to provide an enclosed volume, a delivery line fluidically coupled to the plurality of reactant gas sources and fluidically directly coupled to the first closure to deliver the reactant gases to the enclosed volume, and an output line fluidically coupled to the second closure to remove one or more reactant gases, byproduct gases, or both from the enclosed volume;

sealingly engaging the first closure to the inlet of the housing and sealingly engaging the second closure to the outlet of the housing to form the enclosed volume;

introducing one or more reactant gases, a plasma, or a combination thereof to the enclosed volume via the delivery line; and forming one or more coating layers on all or a portion of the interior surface within the enclosed volume by reaction of the one or more reactant gases, the plasma, or the combination thereof, wherein the reaction comprises a chemical vapor deposition (CVD) reaction, an atomic layer deposition (ALD) reaction, or both, such that the one or more coating layers respectively comprise an ALD layer, a CVD layer, or both.

18. A method of coating an interior surface of a housing defining a volume, the method comprising:

enclosing all or a portion of the volume of the housing to yield an enclosed volume, wherein the housing comprises a formation fluid sampling tool;

introducing one or more reactant gases, plasma, or a combination thereof to the enclosed volume via a delivery line fluidically directly coupled to the first closure; and forming one or more coating layers on all or a portion of an interior surface adjacent the enclosed volume via reaction of the reactant gases, the plasma, or the combination thereof, wherein the reaction comprises a chemical vapor deposition (CVD) reaction, an atomic layer deposition (ALD) reaction, or both, such that the one or more coating layers respectively comprise an ALD layer, a CVD layer, or both.

19. The method of claim 1, wherein the one or more reactant gases comprise a plurality of reactant gases.

20. The method of claim 19, wherein the plurality of reactant gases include a reactant gas for an atomic layer deposition (ALD) process and a reactant gas for a chemical vapor deposition (CVD) process.

21. The method of claim 1, wherein forming the one or more coating layers on all or the portion of the interior surface adjacent the enclosed interior volume of the housing via reaction of the reactant gases further comprises delivering a first reactant gas to the enclosed volume, purging the first reactant gas, and delivering a second reactant gas to the enclosed volume.

22. The method of claim 21 further comprising automating a sequence including steps of delivering the first reactant gas to the enclosed volume, purging the first reactant gas, and delivering the second reactant gas to the enclosed volume.

23. The method of claim 1, wherein forming the one or more coating layers on all or the portion of the interior surface adjacent the enclosed interior volume of the housing via reaction of the reactant gases further comprises: (i) forming an ALD layer by: introducing a first reactant gas into the enclosed volume, such that at least a portion of the first reactant gas chemically bonds with the surface to form a reactive layer; removing unreacted first reactant gas and/or gaseous byproducts from the enclosed volume; introducing a second reactant gas into the enclosed volume, such that at least some of the second reactant gas bonds with the reactive layer to form the ALD layer; and optionally removing unreacted second reactant gas and/or gaseous byproducts from the enclosed volume; (ii) forming a CVD layer by: introducing at least a third reactant gas and optionally a fourth reactant gas into the enclosed volume, such that the at least the third reactant gas chemically reacts with the surface; and optionally removing unreacted third reactant gas and/or optional fourth reactant gas and/or gaseous byproducts from the enclosed volume; or (iii) both forming an ALD layer as set forth in (i) and a CVD layer as set forth in (ii), forming both an ALD layer and a CVD layer including forming an ALD layer on the surface and subsequently forming the CVD layer on the ALD layer or forming the CVD layer on the surface and subsequently forming the ALD layer on the CVD layer.

24. The method of claim 1, further comprising actuating the housing to expose an additional surface and coating at least a portion of the additional surface.

25. The method of claim 1, wherein the housing comprises a focused sampling well tool.

26. The method of claim 25, wherein the focused sampling well tool is operable to take, into one or more sample chambers, one or more fluid samples having a composition representative of a formation fluid of a formation.

27. The method of claim 26, wherein the focused sampling tool comprises a sample line; a guard line; a common line; a pump; a discard line; a sampling line; the one or more sample chambers for the one or more fluid samples; one or more fluid sensors positioned on the guard line, the sample line, the common line, or a combination thereof, and a probe that can extend from the focused sampling tool during formation sampling to define a sample zone fluidly connected with a sample line inlet of the sample line, a guard zone fluidly connected with a guard line inlet of the guard line, or both a sample zone fluidly connected with the sample line inlet of the sample line and the guard zone fluidly connected with the guard line inlet of the guard line, wherein the guard zone and the sample zone are in fluid communication with the formation during operation of the focused sampling well tool.

* * * * *